United States Patent
Zeller et al.

(10) Patent No.: US 8,664,961 B2
(45) Date of Patent: Mar. 4, 2014

(54) VALIDATION OF ARC FLASH DETECTION SYSTEMS

(75) Inventors: Mark L. Zeller, Pullman, WA (US); Angelo D'Aversa, Lafayette Hills, PA (US); Gary W. Scheer, Pullman, WA (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 241 days.

(21) Appl. No.: 12/562,197

(22) Filed: Sep. 18, 2009

(65) Prior Publication Data

US 2010/0073013 A1 Mar. 25, 2010

Related U.S. Application Data

(60) Provisional application No. 61/098,627, filed on Sep. 19, 2008.

(51) Int. Cl.
*H01H 9/50* (2006.01)

(52) U.S. Cl.
USPC ............................ 324/536; 324/96; 324/602

(58) Field of Classification Search
USPC ................................. 324/551, 555, 536, 537
See application file for complete search history.

(56) References Cited

U.S. PATENT DOCUMENTS

| | | | |
|---|---|---|---|
| 3,849,786 A | 11/1974 | Nanba | |
| 4,285,164 A | 8/1981 | Moore | |
| 4,369,364 A * | 1/1983 | Kuntermann | 250/227.11 |
| 4,418,338 A | 11/1983 | Burt | |
| 4,422,719 A | 12/1983 | Orcutt | |
| 4,516,022 A | 5/1985 | Lindgren | |
| 4,614,868 A | 9/1986 | Alster | |
| 4,702,553 A | 10/1987 | Buchmuller | |
| 4,791,518 A | 12/1988 | Fischer | |
| 4,878,144 A | 10/1989 | Nebon | |
| 4,978,863 A | 12/1990 | Lyons | |

(Continued)

FOREIGN PATENT DOCUMENTS

| | | |
|---|---|---|
| EP | 0249815 | 12/1987 |
| EP | 0818075 | 1/1998 |

(Continued)

OTHER PUBLICATIONS

IEEE 1584, Guide for Performing Arc Flash Hazard Calculations, Industry Applications Society, Sep. 23, 2002.

(Continued)

*Primary Examiner* — Arleen M Vazquez
*Assistant Examiner* — Feba Pothen
(74) *Attorney, Agent, or Firm* — Stoel Rives LLP

(57) ABSTRACT

An arc flash validation unit may generate stimulus to be received by an arc flash detection unit (AFDU) and observe the response of the AFDU thereto. The response of the AFDU to the stimulus may allow for validation of the AFDU (e.g., validation that the AFDU is operating as expected). In addition, the arc flash validation unit may determine the response time of the AFDU. Different types of stimulus may be provided to the AFDU, including electro-optical (EO) stimulus (e.g., visible light), current stimulus, and the like. Results of the validation may be displayed on a human-machine interface, which may display an estimate of the total energy that would be released in an actual arc flash event. The estimate may be used to define appropriate safety parameters for the equipment monitored by the AFDU.

25 Claims, 11 Drawing Sheets

(56) References Cited

U.S. PATENT DOCUMENTS

| | | | |
|---|---|---|---|
| 5,170,050 | A | 12/1992 | Giboulet |
| 5,208,542 | A | 5/1993 | Tennies |
| 5,682,101 | A | 10/1997 | Brooks |
| 5,771,091 | A | 6/1998 | Paritsky |
| 5,940,547 | A | 8/1999 | Schumacher |
| 6,011,480 | A | 1/2000 | Schweitzer |
| 6,124,706 | A | 9/2000 | Woods |
| 6,229,680 | B1 | 5/2001 | Shea |
| 6,292,105 | B1 | 9/2001 | Land |
| 6,433,976 | B1 | 8/2002 | Phillips |
| 6,476,396 | B1 | 11/2002 | Forsyth |
| 6,693,438 | B2 | 2/2004 | Shea |
| 6,920,028 | B2 | 7/2005 | Schweitzer |
| 7,035,068 | B2 | 4/2006 | Shea |
| 7,397,596 | B2 | 7/2008 | Yacoubian |
| 7,526,393 | B2 | 4/2009 | Thurmond |
| 7,536,914 | B2 * | 5/2009 | Land et al. .............. 73/705 |
| 7,580,232 | B2 | 8/2009 | Caggiano |
| 7,750,646 | B2 | 7/2010 | Maity |
| 7,791,846 | B2 | 9/2010 | Roscoe |
| 7,952,360 | B2 | 5/2011 | Ganesh |
| 8,154,730 | B2 | 4/2012 | Wu |
| 2003/0205460 | A1 | 11/2003 | Buda |
| 2004/0054921 | A1 | 3/2004 | Land |
| 2004/0125532 | A1 | 7/2004 | Schweitzer |
| 2005/0203672 | A1 | 9/2005 | Restrepo |
| 2006/0261259 | A1 | 11/2006 | Beinhocker |
| 2007/0014060 | A1 | 1/2007 | Land |
| 2007/0070568 | A1 | 3/2007 | Potter |
| 2007/0108986 | A1 * | 5/2007 | Moore et al. .............. 324/522 |
| 2007/0132458 | A1 * | 6/2007 | Allen .................... 324/523 |
| 2007/0242402 | A1 | 10/2007 | Papallo |
| 2008/0004853 | A1 * | 1/2008 | Radibratovic et al. .......... 703/14 |
| 2008/0094612 | A1 | 4/2008 | Land |
| 2008/0170344 | A1 | 7/2008 | Byron |
| 2008/0239592 | A1 | 10/2008 | Roscoe |
| 2009/0161272 | A1 | 6/2009 | Asokan |
| 2009/0189615 | A1 | 7/2009 | Kinsel |
| 2010/0026425 | A1 | 2/2010 | Roscoe |
| 2012/0002195 | A1 | 1/2012 | Wu |

FOREIGN PATENT DOCUMENTS

| | | |
|---|---|---|
| EP | 1646119 | 4/2006 |
| WO | 8808217 | 10/1988 |
| WO | 0221657 | 3/2002 |

OTHER PUBLICATIONS

IEEE 1584a, IEEE Guide for Performing Arc-Flash Hazard Calculations—Amendment 1, IEEE Industry Applications Society, Nov. 29, 2004.

PCT/US2009/057531 Patent Cooperation Treaty, International Search Report and Written Opinion of the International Searching Authority, Nov. 19, 2009.

VAMP Arc Protection Series, VAMP 121, VAMP 221, Jun. 24, 2008.

UTU Arc Protection Systems—a possibility to be protected, Feb. 27, 2002.

George Roscoe, Marcelo E. Valdes, Ray Luna, Methdos for Arc-Flash Detection in Electrical Equipment, Petroleum and Chemical Industry Conference, 2010 Record of Conference Papers Industry Applications Society, Sep. 20-22, 2010.

PCT/US2009/057520 Patent Cooperation Treaty, International Search Report and Written Opinion of the International Searching Authority, Nov. 19, 2009.

PCT/US2009/057536 Patent Cooperation Treaty, International Search Report and Written Opinion of the International Searching Authority, Nov. 19, 2009.

PCT/US2009/057541 Patent Cooperation Treaty, International Search Report and Written Opinion of the International Searching Authority, Nov. 10, 2009.

PCT/US2009/057548 Patent Cooperation Treaty, International Search Report and Written Opinion of the International Searching Authority, Dec. 3, 2009.

Kevin Lippert, Donald M. Colaberardino, Clive W. Kimblin, Understanding IEEE 1584 Arc Flash Calculations, IEEE Industry Applications Magazine, May 2005.

ABB, Arc Protection Relay, Product Guide REA 10_, Jun. 22, 2005.

ABB, Arc Protection System REA, Jun. 2005.

Robert Wilson, Rainer Harju, Juha Keisala, Sethuraman Ganesan, Tripping with the Speed of Light: Arc Flash Protection, Mar. 27, 2007.

Meyle, LBW21 Arc Detection System Operating Instruction, Dec. 2004.

European Search Report, Aug. 5, 2013 for European Patent Application 09815287.9.

European Search Report, Aug. 5, 2013 for European Patent Application 09815298.6.

European Search Report, Jul. 2, 2013 for European Patent Application 09815295.2.

* cited by examiner

VALIDATION OF ARC FLASH DETECTION SYSTEMS

CROSS-REFERENCE TO RELATED APPLICATIONS

This application claims the benefit under 35 U.S.C §119(e) of U.S. Provisional Patent Application Ser. No. 61/098,627 entitled "Validation of Arc Flash Detection Systems," which was filed Sep. 19, 2008, and is hereby incorporated by reference in its entirety.

TECHNICAL FIELD

This disclosure relates to validation of arc flash detection systems. More particularly, this disclosure relates to applying stimulus to an arc flash detection system and measuring the response of the arc flash detection system thereto.

DETAILED DESCRIPTION

Figure 1A:
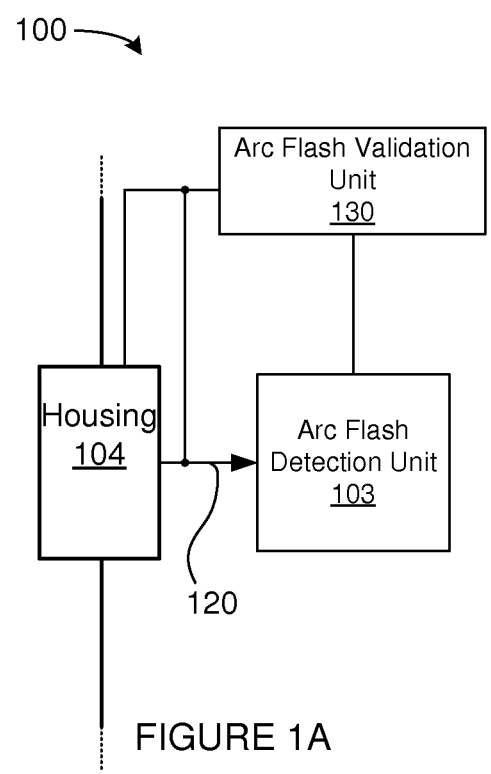
FIG. 1A is a system diagram of a power system comprising an arc flash detection unit and an arc flash validation unit.

Disclosed herein are systems and methods for validating an arc flash protection system, such as an arc flash detection unit. Arc flashes pose a serious risk to both personnel and equipment in the vicinity of a flash. An arc flash may produce intense electro-optical (EO) radiation (including visible light) in the area of the arc. In addition, an overcurrent condition may be created on electric conductor(s) that feed the arc.

An arc flash detection unit (AFDU) may be configured to monitor a portion of a power system (e.g., an enclosure, housing, or the like). The AFDU may be configured to detect an arc flash event based on stimulus received from the power system. The AFDU may make use of various different types of stimulus including, but not limited to: EO radiation detected in the vicinity of the power system, current levels within the power system, voltage levels at various points within the power system, heat, chemical detection, pressure differentials (e.g., sound), detection of particulates within an enclosure, or the like.

The systems and methods disclosed herein may validate that an AFDU is functioning and/or is properly configured to detect an arc flash event. The validation may be performed by causing the AFDU to receive stimulus indicative of an arc flash event (e.g., current levels and/or EO radiation levels that are indicative of an arc flash event). The response of the AFDU to the stimulus may indicate whether the AFDU is functioning and/or whether the AFDU is configured properly. In addition, the time required for the AFDU to respond to the stimulus may be evaluated to estimate the total energy that would be released in an actual arc flash event corresponding to the stimulus provided to the AFDU and/or the response time of the AFDU.

The time required to detect an arc flash event by a protection system (e.g., an AFDU) may be used to determine a total time required to clear the arc flash (e.g., the total time required to clear the arc flash may be a sum of the time required to detect the flash plus the time required to trip protective elements responsive to the detection). The time required to clear the arc flash may be referred to as a "total arcing time," which may be used to calculate the incident energy released by the arc flash event (given the arc current, resistance, conductor gap, and the like). The detection time of an arc flash protection system may vary depending upon the configuration of the protection system (e.g., the sensitivity of the system). System sensitivity may be selected to provide a balance between providing adequate arc flash protection and preventing misoperation (e.g., detecting false positives).

The "Guide for Performing Arc Flash Hazard Calculations," which is promulgated by the Institute of Electrical and Electronics Engineers (IEEE) as IEEE 1584, provides several means for calculating arc flash incident energy, one of which is provided below in Equation 1:

$$\mathrm{Log}(E_N) = K_1 + K_2 + 1.0811 \cdot \mathrm{Log}(I_a) + 0.0011 \cdot G \qquad \text{Eq. 1}$$

In Equation 1, $E_N$ is the arc flash incident energy, $K_1$ is a switchgear-dependent constant value (depending upon whether the switchgear is in an open or box configuration), $K_2$ is a constant (0 for ungrounded or high-resistance grounded switchgear and −0.113 for grounded systems), $I_a$ is the maximum arcing current, and G is a gap between conductors within the switchgear.

The IEEE 1584 standard further provides means for determining an arc-protection boundary as follows:

$$D_b = \left[ 4.184 \cdot C_f \cdot E_n \cdot \left( \frac{t}{0.2} \right) \cdot \left( \frac{610^x}{E_b} \right) \right]^{\frac{1}{x}} \qquad \text{Eq. 2}$$

In Equation 2, $D_b$ is the distance of the boundary from the arcing point, $C_f$ is a voltage constant (1.0 for voltages above 1 kV), $E_n$ is the normalized arc flash incident energy (e.g., calculated per Equation 1 above), $E_b$ is the incident energy at the boundary (5.0 J/cm² for bare skin), and x is a distance exponent constant (0.973 for 5 kV switchgear).

The protection boundary may determine where maintenance personnel may safely work in relation to the switchgear and/or may determine what, if any, protective gear should be used by the personnel.

Other standards exist for calculating arc flash energy to determine appropriate proximity and/or protective gear requirements. For instance, the National Fire Protection Association (NFPA) provides for the calculation of an arc thermal performance value (ATPV), which is similar to the IEEE 1584 arc flash incident energy. The ATPV may determine a proximity boundary in which maintenance personnel may safely work. In addition, the ATPV and proximity boundary may indicate the nature of the protective gear that should be used by personnel. Other arc flash safety-related standards are provided by the National Electric Code (NEC) and Occupational Safety and Health Administration (OSHA).

The arc flash detection validation systems and methods disclosed herein may allow for tuning of an AFDU to provide adequate protection for maintenance personnel (as well as other switchgear equipment). In addition, the arc flash detection validation systems and methods disclosed herein may validate that the AFDU in fact performs as expected.

In some embodiments, the systems and methods disclosed herein may provide various types of stimulus to an AFDU to ensure that the AFDU is functioning properly and/or is properly configured (e.g., has an appropriate sensitivity level). The stimulus may include EO radiation and/or current stimulus. The response of the AFDU may be monitored to determine whether the stimulus caused the AFDU to detect an arc flash event.

The systems and methods disclosed herein may be further configured to determine the response time of the AFDU (e.g., the time delay between the time stimulus is provided to the AFDU and the time the AFDU detects an arc flash event). As illustrated above, the response time of an AFDU may be used to determine the total arcing time of an actual arc flash event (e.g., the sum of the arc flash detection time and the clearing time for the system), which may be used to determine arc flash incident energy and the like. This information may provide guidance regarding the protective measures (e.g., protective clothing, distance from switchgear, etc.) that should be taken by persons working in the vicinity of the switchgear. In addition, the information may provide for the selection of appropriate arc flash-resistant equipment for use in the power system protected by the AFDU (e.g., equipment capable of withstanding an arc flash blast of a particular intensity and/or duration).

FIG. 1A shows one embodiment of an AFDU 103 in an electrical power system 100. The AFDU 103 may be communicatively coupled to portions of the power system 100 to receive stimulus 120 therefrom. As will be discussed below, the AFDU 103 may be configured to detect an arc flash event occurring within the power system 100 (e.g., within the housing 104) based on the stimulus 120 received from the power system 100 (e.g., current measurements, EO radiation measurements, etc.).

In some embodiments, the AFDU 103 may be communicatively coupled to one or more current transformers, or other measurement devices, configured to provide the AFDU 103 with stimulus 120 comprising current measurements from various points within the power system 100 (e.g., on either side of a housing 104 in the electrical power system 100). The housing 104 may include components that may be susceptible to arc flash events (e.g., switchgear, circuit breakers, and the like).

The AFDU 103 may be configured to receive other types of stimulus 120, such as measurements of EO radiation detected by one or more EO radiation collectors disposed within the vicinity of the power system 100. The EO radiation collectors may be disposed within the housing 104 and/or may be positioned to capture EO radiation produced by an arc flash event. In some embodiments, the EO radiation collectors may be positioned within a switchgear enclosure 105 within the housing 104.

Although particular types of stimulus 120 are discussed herein (e.g., current and EO stimulus), the AFDU 103 could be configured to detect an arc flash event based on any number of different types of stimulus 120. Therefore, this disclosure should not be read as limited in this regard.

The AFDU 103 may be configured to invoke certain protective functions upon detecting an arc flash event. For example, the AFDU 103 may trigger a circuit breaker, a switch, or other equipment to remove an arcing circuit from power and/or isolate the circuit from the rest of the power system 100. Alternatively, or in addition, the AFDU 103 may produce an alarm signal that may be received by another protective system (e.g., a protective relay, an IED, or the like), which may be configured to take one or more protective actions responsive to the alarm. The alarm may be transmitted to other remote devices and/or may be made available for display on a human-machine interface (HMI). These protective actions may reduce the amount of energy released by the arc flash event and/or may alert other systems and/or personnel to the arc flash event.

The detection time of the AFDU 103 may depend upon a configuration of the AFDU 103 (e.g., the sensitivity of the AFDU 103 to the stimulus 120). As discussed above, certain stimulus 120, such as high current values and/or intense EO radiation flashes, may be indicative of an arc flash event. In some embodiments, the AFDU 103 may be configured to have a particular sensitivity and/or employ a particular arc flash detection algorithm. The sensitivity level of the AFDU 103 may be set to provide an acceptable balance between safety (e.g., quick detection) and reliability (e.g., prevent misoperation). The sensitivity level may be configured to prevent detection of false arc flash conditions (e.g., ambient light, heating, high usage conditions, or the like), while remaining sufficiently sensitive to protect personnel and equipment in the vicinity of the power system 100. The sensitivity level and/or configuration of the AFDU 103 may be adapted to changing conditions within the power system 100. For example, the AFDU may be set to a high-sensitivity configuration during servicing of the power system 100 (e.g., when personnel are working in close proximity to the housing 104) and may be set to a low-sensitivity configuration during times of peak power demand (e.g., to prevent misoperation due to high-demand current levels).

An arc flash validation unit 130 may be configured to validate the operation of the AFDU 103. In some embodiments, the arc flash validation unit 130 may be configured to provide and/or cause the AFDU 103 to receive stimulus 120 indicative of an arc flash event. The arc flash validation unit 130 may be communicatively coupled to an output of the AFDU 103 to determine the response, if any, of the AFDU 103 to the stimulus 120. The arc flash validation unit 130 may determine a response time of the AFDU 103 by comparing the time the stimulus 120 is provided to the AFDU 103 and the time the AFDU 103 detects an arc flash event and/or triggers protective elements of the power system 100.

The arc flash validation unit 130 may be further configured to determine and/or detect the configuration (e.g., sensitivity level) of the AFDU 103. The AFDU 103 may be capable of operating in one of a plurality of configurations and/or at various different sensitivity levels. For example, the AFDU 103 may be placed into a "high-sensitivity" mode when personnel are working in the vicinity of the power system 100. The high-sensitivity mode may cause the AFDU 103 to detect an arc flash event for a lower level of stimulus 120 than when the AFDU 103 is configured to operate in a "low-sensitivity" mode. The arc flash validation unit 130 may verify the configuration of the AFDU 103 by causing the AFDU 103 to receive stimulus 120 adapted to be sufficient to cause an AFDU 103 operating in a high-sensitivity mode to detect an arc flash event, but that would not cause an AFDU 103 operating in another mode to detect an arc flash event (e.g., operating in a low-sensitivity mode). If the arc flash validation unit 130 receives an arc flash detection signal from the AFDU 103 responsive to this stimulus 120, the configuration of the AFDU 103 may be verified. Similarly, the arc flash validation unit 130 may be configured to "ramp-up" the stimulus 120 provided to the AFDU 103 (e.g., gradually increase the intensity, duration, and/or types of stimulus 120 provided to the AFDU 103) until an arc flash detection signal is detected. In this way, the arc flash validation unit 130 may determine and/or validate the configuration (e.g., sensitivity level) of the AFDU 103.

Figure 1B:
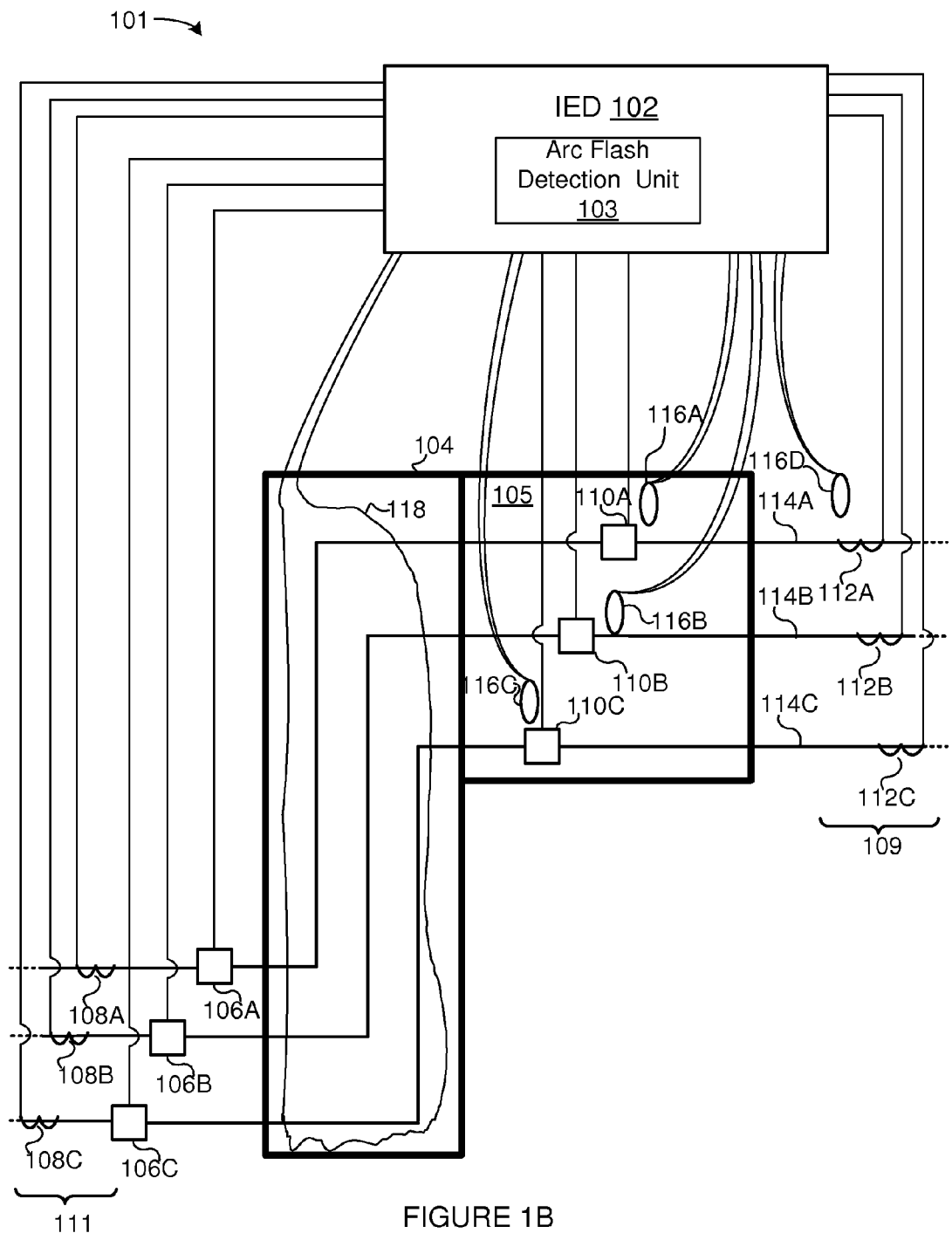
FIG. 1B is a block diagram of an intelligent electronic device (IED) including an arc flash detection unit.

FIG. 1B shows an electrical power system 101 that includes an intelligent electronic device (IED) 102 comprising an AFDU 103. The IED 102 may provide various monitoring and protection services to the power system 101, including electrical power system components within a housing 104.

As used herein, an IED (such as the IED 102 of FIG. 1) may refer to any one or combination of: a CPU-based relay and/or protective relay, a digital fault recorder, a phasor measurement unit (PMU), a phasor measurement and control unit (PMCU), a phasor data concentrator (PDC), a wide area control system (WACS), a relay with phasor measurement capabilities, a wide area protection system (WAPS), a Supervisory Control and Data Acquisition (SCADA) system, a Programmable Automation Controller (PAC), a Programmable Logic Controller (PLC), a dedicated arc flash protection controller (e.g., an AFDU), a system integrity protection scheme, or any other device capable of monitoring and/or protecting an electrical power system. Accordingly, the IED 102 may comprise one or more processors, memories, computer-readable storage media, communications interfaces, HMI components, and the like. In the FIG. 1B embodiment, the IED 102 may be a protective relay, such as the SEL 751 manufactured by and available from Schweitzer Engineering Laboratories, Inc. of Pullman, Wash.

As shown in FIG. 1B, the AFDU 103 may be implemented within the IED 102 (e.g., as a component of the IED 102). The AFDU 103 may be implemented as machine-readable and/or machine-interpretable instructions stored on a computer-readable storage media of the IED 102. Alternatively, or in addition, the AFDU 103 may comprise one or more hardware components.

The IED 102 and/or AFDU 103 may be configured to monitor equipment disposed within the housing 104. The housing 104 may comprise a switchgear cabinet, a sealed enclosure, or any other housing type. Therefore, the housing 104 may enclose switchgear equipment, such as circuit breakers 110A, 110B, and/or 110C, and the like.

The AFDU 103 may receive various types of stimulus 120 from the power system 101. The stimulus 120 may be received directly (e.g., by sensors coupled to the AFDU 103) and/or indirectly through another device, such as the IED 102. In the FIG. 1B example, the AFDU 103 is configured to receive current stimulus (current measurements obtained by current transformers) and EO stimulus (EO radiation captured by EO radiation collectors). The AFDU 103 may be configured to detect an arc flash event based on the current and EO stimulus 120.

The AFDU 103 may be configured to monitor a three-phase power signal comprising three conductors 114A, 114B, and 114C, each of which may run through the housing 104 (one for each phase of the three-phase power signal). For instance, the conductor 114A may carry an "A phase" electrical power signal, the conductor 114B may carry a "B phase" electrical power signal, and the conductor 114C may carry a "C phase" electrical power signal. Although a three-phase power signal is referred to herein, one skilled in the art will recognize that the teachings of this disclosure could be applied to power systems comprising any type and/or number of power signals, and, as such, the teachings of the disclosure should not be read as limited in this regard.

The AFDU 103 receives current measurements from current transformers (CTs) communicatively and/or electrically coupled to the conductors 114A, 114B, and/or 114C; CTs 112A, 112B, and 112C are coupled to the conductors 114A, 114B, and 114C at a first location 109, and CTs 108A, 108B, and 108C are coupled to the conductors 114A, 114B, and 114C at a second location 111 (e.g., on an opposite end of the housing 104).

The AFDU 103 is communicatively coupled to EO radiation collectors 116A, 116B, 116C, 116D, and 118, which may be configured to detect EO radiation emitted within the vicinity of the housing 104. As used herein, an EO radiation collector, such as the EO radiation point collectors 116A, 116B, 116C, 116D, and/or the loop EO radiation collector 118, may be configured to capture and/or collect various types of EO radiation including visible EO radiation (e.g., visible light), infra-red (IR) radiation, ultra-violet (UV) radiation, and/or EO radiation at other wavelengths. Moreover, as used herein, light or a "light event" may refer to EO radiation that comprises EO energy at many different wavelengths, some of which may be visible to the human eye and some of which may not. Therefore, this disclosure should not be read as limited to detection and/or processing of only EO radiation visible to humans, but should be read as encompassing any type of EO radiation known in the art.

The EO radiation collectors 116A, 116B, 116C, 116D, and 118 may be distributed within the housing 104 and may be communicatively and/or electro-optically coupled to the IED 102 and/or AFDU 103. In some embodiments, the EO radiation collectors 116A, 116B, 116C, and/or 116D may be "point collectors," comprising fiber-optic leads (or other EO conductive material) configured to selectively detect EO radiation within the housing 104 (e.g., detect EO radiation at particular points and/or locations within the housing 104). The point collectors 116A, 116B, 116C, and/or 116D may be placed and/or positioned within the housing 104 so as to be capable of collecting EO radiation produced by an arc flash event therein (e.g., in the vicinity of the switchgear components, such as the circuit breakers 110A, 110B, and/or 110C, a breaker trunk compartment (not shown), or the like). For example, the point collectors 116A, 116B, 116C, and/or 116D may be positioned to have a line-of-sight and/or an electro-optical path to respective breakers 110A, 110B, and/or 110C (e.g., to avoid "shadows" or other obscuring structures within the housing 104). In some embodiments, the EO radiation point collectors 116A, 116B, 116C, and/or 116D may be optically coupled to additional optical elements (not shown), such as mirrors, fiber-optic leads, lenses, EO conductive materials, or the like, which may be configured to direct EO radiation produced within the housing 104 and/or in the vicinity of the switchgear components (e.g., breakers 110A, 110B, and/or 110C) to one or more of the EO radiation collectors 116A, 116B, 116C, and/or 116D.

The EO radiation collectors 116A, 116B, 116C, and/or 116D may comprise EO conductive materials, such as fiber-optic filaments, capable of collecting EO radiation and transmitting a portion thereof to the IED 102 and/or AFDU 103. Alternatively, or in addition, the EO radiation collectors 116A, 116B, 116C, and/or 116D may be capable of collecting EO radiation and transmitting an electrical signal and/or other indicator of the detected EO radiation to the IED 102 and/or AFDU 103 (e.g., via a communication network or the like).

The AFDU 103 may be coupled to other devices capable of collecting EO radiation, such as the loop EO radiation collector 118, which may extend through a portion of the housing 104. The loop EO radiation collector 118 may comprise one or more sheathed fiber-optic cables (or other EO conductive material), wherein portions of the cable are exposed (e.g., portions of sheathing around the EO conductive material are removed). The loop EO radiation collector 118 may be configured to receive EO radiation through these exposed portions. The EO radiation so received may be transmitted to the IED 102 and/or AFDU 103. Alternatively, or in addition, the loop EO radiation collector 118 may comprise a dedicated EO radiation collector (not shown), which may transmit an electrical signal or other indicator of the EO radiation detected thereby (e.g., via a communication network or the like).

Although FIG. 1B depicts the AFDU 103 receiving EO stimulus from a particular set of EO radiation collectors 116A, 116B, 116C, 116D, and 118, one skilled in the art will recognize that the teachings of this disclosure could be applied to any number and/or type of EO radiation collectors, including, but not limited to: optical lenses, waveguides, concentrators, and the like. Therefore, this disclosure should not be read as limited to any particular number, type, and/or arrangement of EO radiation collectors. Moreover, although a particular housing 104 is depicted, the disclosure is not limited in this regard; the teachings of this disclosure could be applied to any housing known in the art including, but not limited to: a breaker box, switch box, busbar enclosure, duct, conduit, or other enclosure or housing type.

The AFDU 103 may be configured to detect an arc flash event based on inter alia stimulus received from the CTs 108A, 108B, 108C, 112A, 112B, and 112C and/or EO radiation collectors 116A, 116B, 116C, 116D, and 118. High-levels of EO radiation and/or high current levels may be indicative of an arc flash event occurring within the housing 104. Responsive to the AFDU 103 detecting an arc flash event, the IED 102 may be configured to take one or more protective actions, such as tripping one or more circuit breakers (e.g., breakers 106A, 106B, and/or 106C), removing one or more of the conductors 114A, 114B, and/or 114C from power, transmitting one or more alarm signals to external devices, displaying an alarm on an HMI, or the like.

For example, the IED 102 may be communicatively coupled to the circuit breakers 106A, 106B, 106C via a communication network (e.g., over an Ethernet network, a SCADA network, an IEEE C37.118 network, a wireless network, or the like). Responsive to the AFDU 103 detecting an arc-flash event on one or more of the conductors 114A, 114B, and/or 114C, the IED 102 may be configured to interrupt the power flow thereon.

Figure 2:
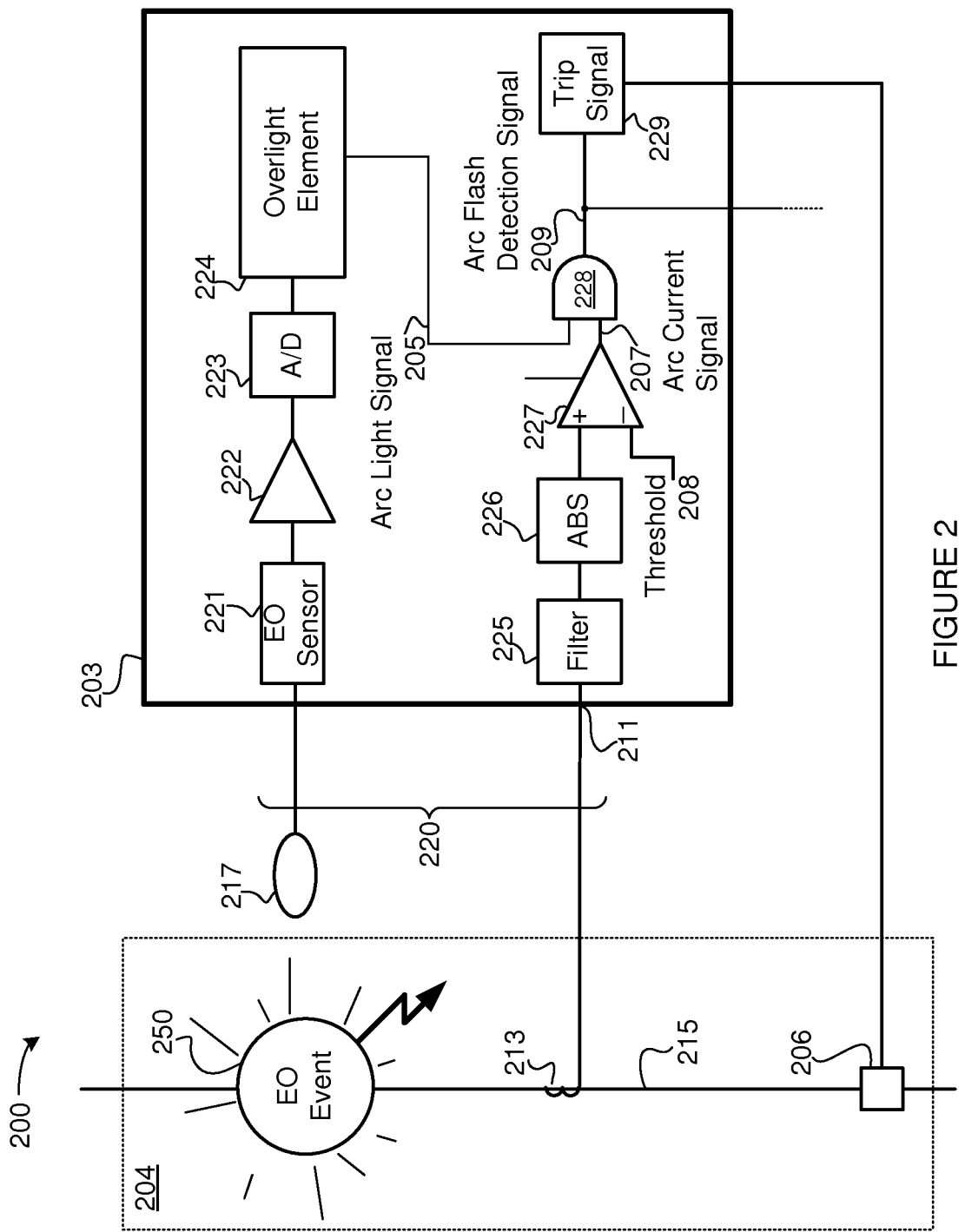
FIG. 2 is a functional block diagram of an arc flash detection unit.

FIG. 2 depicts a power system 200 comprising an AFDU 203. The AFDU 203 depicted in FIG. 2 may be part of an IED, such as IED 102 depicted in FIG. 1B, and/or may be an independent device (e.g., add-on device), which may be communicatively coupled to an IED.

In the FIG. 2 embodiment, the AFDU 203 may monitor a portion of an electrical power system 200, which may comprise a conductor 215 and a circuit breaker 206. The AFDU 203 may receive various types of stimulus 220 from the electrical power system 200. In the FIG. 2 example, the AFDU 203 receives current and EO radiation stimulus 220 via respective measurement devices 213 and 217. A CT 213 may be coupled to the conductor 215 to measure a current flowing thereon. The CT 213 may be communicatively coupled to an input 211 of the AFDU 203 to provide current measurement stimulus thereto. An EO radiation collector 217 may be placed in proximity to the conductor 215 and/or within a housing 204 through which the conductor 215 passes. The EO radiation collector 217 may comprise a point-source EO radiation collector, a loop EO radiation collector, or any other device capable of collecting and/or transmitting EO radiation.

An arc flash event occurring in the vicinity of the conductor 215 (e.g., between the conductor 215 and ground, another conductor, a switch (not shown), on a circuit breaker (not shown), or the like), may produce an EO event 250. The EO event 250 caused by the arc flash may cause EO radiation to be emitted, a portion of which may be collected by the EO radiation collector 217. As discussed above, the EO event 250 may produce EO radiation at various frequencies and/or wavelengths, some of which may be visible to a human. The EO radiation collector 217 may be electro-optically coupled to the AFDU 203 to transmit a portion of the EO radiation emitted by the EO event 250 and collected by the EO radiation collector 217 to the EO sensor 221 of the AFDU 203.

The EO sensor 221 may be configured to convert EO radiation received from the EO radiation collector 217 into a signal indicative of the EO radiation (e.g., an electrical signal). Accordingly, the EO sensor 221 may comprise a photodiode (such as a silicon photodiode), a photo resistor, Charge-Coupled Device (CCD) detector, an IR detector, a complementary metal-oxide-semiconductor (CMOS) device, or any other device or structure capable of converting EO radiation into an electrical signal.

In some embodiments, the signal produced by the EO sensor 221 may be amplified by an amplifier 222 and sampled (e.g., converted into a discrete, digital value) by an A/D converter 223. The amplifier 222 may comprise a fixed or variable gain amplifier. In alternative embodiments, the amplifier 222 may be omitted. In embodiments implemented using analog circuitry, the A/D converter 223 may be omitted.

Although FIG. 2 shows the EO sensor 221, amplifier 222, and A/D converter 223 as part of the AFDU 203, one skilled in the art will recognize that these components could be disposed in proximity to the EO radiation collector 217. In this alternative embodiment, the EO radiation collector 217 may be configured to generate a signal indicative of detected EO radiation (e.g., as a sampled, discrete measurement) using a local EO sensor, amplifier, and/or A/D converter (not shown), and could communicate the measurement(s) to the AFDU 203 via a communication network (not shown) or the like.

The AFDU 203 includes an overlight element 224, which may produce an arc light signal 205 based on the EO measurements received via the EO sensor 221. Assertion of the arc light signal 205 may indicate that the AFDU 203 has detected EO radiation indicative of an arc flash event.

In some embodiments, the overlight element 224 may compare the sampled, discrete EO radiation measurements produced by the A/D converter 223 to an overlight threshold value. The overlight threshold value may represent an EO radiation level that is indicative of an arc flash event (e.g., as opposed to changes in ambient light conditions or the like). The arc light signal 205 may be asserted if the EO radiation level exceeds the threshold. The threshold may be adapted according to a desired sensitivity level of the AFDU 203.

The overlight element 224 may implement other comparison techniques. For example, the overlight element 224 may implement an inverse time comparison (inverse time over EO radiation intensity plot), which may cause the arc light signal 205 to assert if the intensity of the EO radiation is maintained above a threshold for a time determined by an inverse time over-EO radiation plot. The time threshold may be based upon the intensity of the EO radiation; as the intensity of the EO radiation increases, the time required to maintain the EO intensity at the particular level decreases. Alternatively, or in addition, the overlight element 224 may comprise an integrator, which may assert the arc light signal 224 if a particular cumulative intensity is achieved within a predetermined time period (e.g., within a sliding window). Although various comparison techniques are described herein, the overlight element 224 is not limited in this regard and could employ and/or incorporate any comparison method and/or technique known in the art.

Assertion of the arc light signal 205 may be indicative of an arc flash event. Therefore, in some embodiments, the arc light signal 205 may be transmitted to an IED (not shown), may cause one or more protective actions to take place, such as removing the conductor 215 from the power system (e.g., tripping the circuit breaker 206), and/or may be provided as an output of the AFDU 203 (not shown).

In the FIG. 2 embodiment, AFDU 203 is not configured to detect an arc flash event based on EO stimulus alone. Therefore, the arc light signal 205 flows to an AND gate 228, which combines the arc light signal 205 with an arc current signal 207, which may be asserted upon detection of an overcurrent condition (discussed below).

A current input 211 of the AFDU 203 may be configured to receive current measurements acquired by a CT 213 communicatively and/or electrically coupled to the conductor 215. A filter 225 may filter the current measurements (e.g., using a low-pass filter, a band-pass filter, an anti-alias filter, a combination of filters, or the like). The magnitude of the current measurements may be calculated by an absolute value block 226 and/or sampled (e.g., using an A/D converter (not shown)).

A comparator 227 may use the received current measurements to assert an arc current signal 207. The comparator 227 may implement any comparison technique known in the art. In some embodiments, the comparator 227 may compare the current measurements to a threshold 208. The threshold 208 may be an overcurrent threshold indicative of current levels produced during an arc flash event. Therefore, the arc current signal 207 may be asserted if the current measurements exceed the threshold 208. The threshold 208 may be configurable to allow the sensitivity of the AFDU 203 to be adjusted.

The AFDU 203 may include other overcurrent comparison mechanisms and/or techniques. For example, the AFDU 203 may implement an inverse time over-current comparison, which, as discussed above, may assert the arc current signal 207 if the current measurements exceed a threshold for a particular time period (the time period may be dependent upon the magnitude of the current measurements), an integrator comparison technique (e.g., a sliding window comparator), or the like.

The arc light signal 205 and the arc current signal 207 flow to the AND gate 228, the output of which may comprise an arc flash detection signal 209. In some embodiments, the AFDU 203 may further include a security timer (not shown). The security timer may supervise the arc flash detection signal 209, such that the arc flash detection signal 209 is asserted only if the output of the AND gate 228 is asserted for a pre-determined time period and/or for a pre-determined number of measurement cycles.

The arc flash detection signal 209 may be used to activate one or more protective modules (e.g., protective modules and/or functions of an IED (now shown) upon which the AFDU 203 is implemented). FIG. 2 shows the arc flash detection signal 209 activating a trip signal module 229. The trip signal module 229 may comprise a protective function of a protective device, such as an IED. Assertion of the arc flash detection signal 209 may cause the trip signal module 229 to generate a trip signal to the circuit breaker 206. As discussed above, the arc flash detection signal 209 may be communicated to an IED or other device configured to monitor and/or protect the power system 200. Responsive to assertion of the signal 209, the IED may take one or more protective actions as described above. The circuit breaker 206 may remove the conductor 215 from power, which may clear the arc flash event and minimize the energy released thereby. The AFDU 203 (alone or in conjunction with another device, such as an IED) may be configured to provide other arc flash event monitoring and/or protection mechanisms including, but not limited to: transmitting the arc flash detection signal 209 to an HMI, IED, or other device; tripping additional circuit breakers; diverting power to or from portions of a power system; and the like. In some embodiments, the trip signal generator 229 may be configured to transmit the arc flash detection signal in a particular format and/or using a particular protocol, including, but not limited to: Ethernet, SCADA, IEEE C37.118, SNMP, or the like. As will be appreciated by one of skill in the art, any signaling and/or control mechanism could be used under the teachings of this disclosure.

The value of the threshold(s) used by the overlight element 224 and/or the comparator 227 may determine the sensitivity of the AFDU 203 (e.g., the value of the overcurrent threshold 208 and/or the thresholds used by the overlight element 224). These thresholds may be configurable (e.g., via a programming interface or other HMI) to allow the sensitivity of the AFDU 203 to be set as desired. In addition, the manner in which the AFDU 203 combines the arc detection signals responsive to the various stimulus types may be configurable (e.g., the arc light signal 205 produced responsive to EO stimulus and the arc current signal 207 produced responsive to current stimulus). For instance, in some embodiments, the AFDU 203 may be configured to assert the arc flash detection signal 209 if either the arc light signal 205 or the arc current signal 207 is asserted. In this configuration, the AND gate 228 may be replaced with an OR gate (not shown). This configuration change may be made via a programming interface (e.g., an HMI) or by manually reconfiguring the hardware components that make up the AFDU 203. As will be appreciated by one of skill in the art, in embodiments where the AFDU 203 receives other types of stimulus (e.g., voltage signals, temperature measurements, chemical readings, pressure measurements, etc.), the corresponding detection signals may be similarly combined (e.g., using AND, OR, or other combining logic).

The systems and methods discussed herein may determine the configuration of the AFDU 203 and/or to validate that the AFDU 203 is operating as expected. Validating the AFDU 203 may include determining the stimulus 220 required for the AFDU 203 to detect an arc flash event (e.g., the levels of current and/or EO radiation stimulus that must be received by the AFDU 203 before the arc light signal 205, arc current signal 207, and/or arc flash detection signal 209 are asserted). In addition, the arc flash validation unit may determine the manner in which the arc light signal 205 and arc current signal 207 are combined by the AFDU 203 (e.g., in an AND, an OR, or other configuration) and/or determine the response time of the AFDU 203 (e.g., the time required for the AFDU 203 to generate an arc flash detection signal 209 and/or for the trip signal module 229 to produce a tripping signal under various stimulus conditions).

Figure 3:
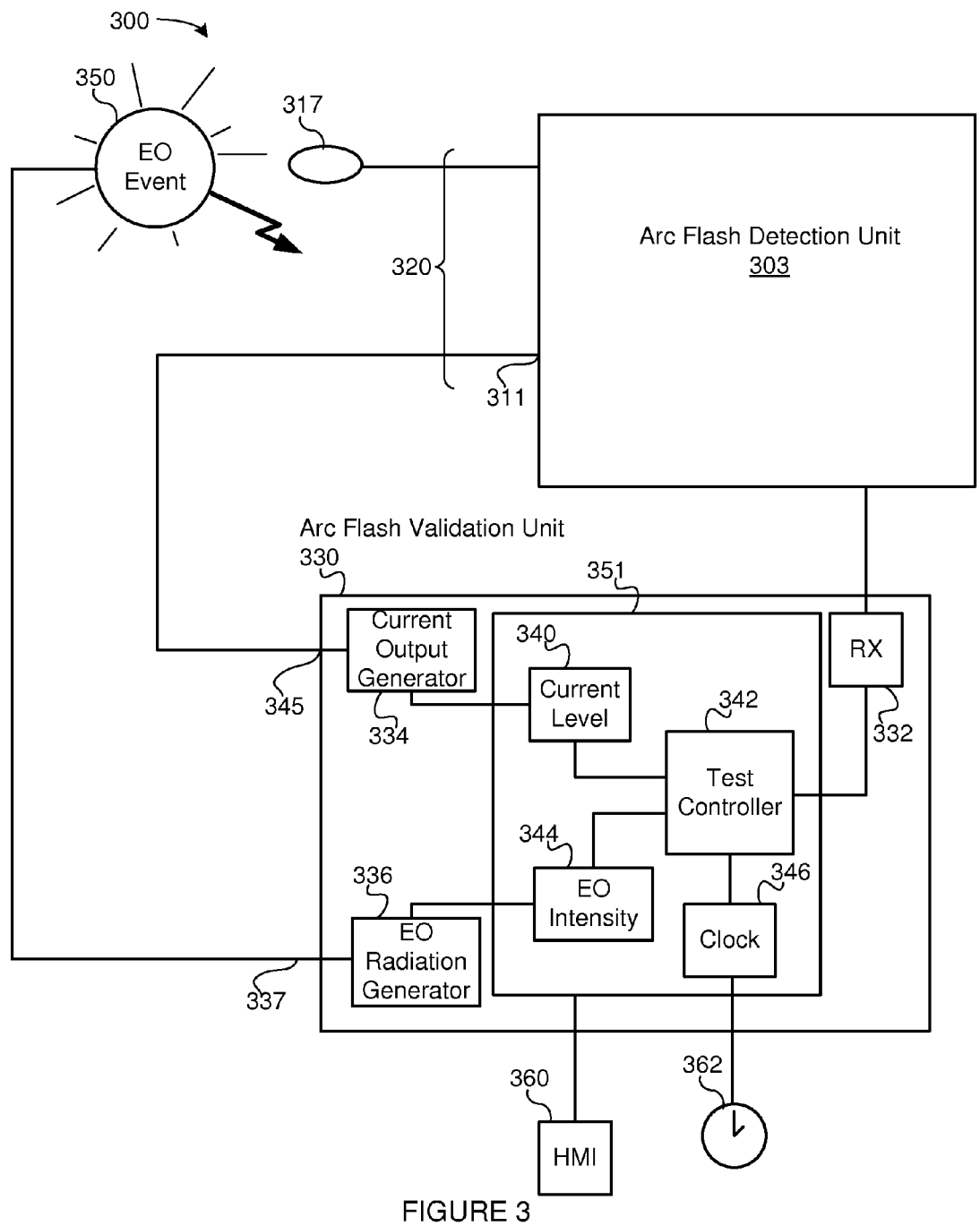
FIG. 3 is a functional block diagram of one embodiment of an arc flash validation unit.

FIG. 3 provides one example of an arc flash validation unit configured to validate an AFDU. FIG. 3 is a functional block diagram of one embodiment of an arc flash validation unit 330. The AFDU 303 of FIG. 3 may be implemented within an IED (e.g., as a component of an IED), such as the IED 102 of FIG. 1B. Alternatively, or in addition, the AFDU 303 may be implemented as a stand-alone device that may be communicatively coupled to an IED or other device. The AFDU 303 may receive stimulus 320 from power system components (not shown) comprising current and/or EO radiation measurements. As discussed above, the stimulus 320 may be obtained by various measurement devices. In the FIG. 3 example, the AFDU 303 receives current stimulus (e.g., obtained by one or more CTs (not shown)) via a current measurement input 311 and receives EO radiation and/or EO radiation measurements from one or more EO radiation collectors (e.g., EO radiation collector 317).

The arc flash validation unit 330 may be configured to cause the AFDU 303 to receive stimulus 320 that may be indicative of an arc flash event under certain configurations of the AFDU 303.

The arc flash validation unit 330 may comprise various modules, including a receiver module 332, a test controller module 342, a clock module 346, a current level module 340, a current output generator 334, an EO intensity module 344, and an EO radiation generator 336 (referred to herein as the FIG. 3 modules). Portions of the FIG. 3 modules may be implemented as machine-readable and/or machine-interpretable instructions. Therefore, the arc flash validation unit 330 may comprise a processor 351 configured to execute/interpret the instructions comprising the FIG. 3 modules. The instructions may be stored on one or more computer-readable storage media (not shown) and, in some embodiments, may be embodied thereon as distinct software modules. Portions of the FIG. 3 modules (e.g., receiver 332, current output generator 334 and/or EO radiation generator 336) may comprise hardware components. Therefore, various modules (e.g., current level module 340, EO intensity module 334) may be configured to operate and/or interact with particular machine components (e.g., communications interfaces, circuitry components, and the like) and, as such, may be tied to the particular machine components.

The AFDU 303 may receive current stimulus (e.g., obtained by one or more CTs) via a current stimulus input 311 and may be configured to receive EO radiation stimulus from one or more EO radiation collectors (e.g., EO radiation collector 317). As described above in conjunction with FIG. 2, the AFDU 303 may filter, amplify, sample, digitize (e.g., using an A/D converter), and/or otherwise process the stimulus 320 for use in detecting an arc flash event.

The arc flash validation unit 330 may be configured to provide stimulus 320 to the AFDU 303 and to detect a response (if any) of the AFDU 303 thereto. As shown in FIG. 3, the arc flash validation unit 330 may be communicatively coupled to an output of the AFDU 303 via a receiver 332. As such, the arc flash validation unit 330 may receive arc flash detection signals and/or tripping signals generated by the AFDU 303. Alternatively, or in addition, in embodiments where the AFDU 303 is implemented in conjunction with (e.g., as a component of) an IED, the receiver 332 may be communicatively coupled to an output of the IED.

The receiver 332 may be coupled to the AFDU 303 (or other device) via a communications network (e.g., an Ethernet, SCADA, IEEE C37.118, SNMP, or other network). Alternatively, or in addition, the receiver 332 may be directly coupled to the output via a direct wire-to-wire connection, a cross-over cable (e.g., null modem cable), a dedicated communication line (e.g., an RS232 cable), or the like. In some embodiments, the receiver 332 may be configured to control the transmission of arc flash detection signals (e.g., tripping signals, alarms, etc.) generated by the AFDU 303 or other device. As such, during testing, the receiver 332 may prevent arc flash detection signals from being transmitted to other power system components (e.g., protective devices, IEDs, circuit breakers, switches, alarms, or the like) to prevent misoperation of those devices responsive to false arc flash detection signals generated during testing.

The arc flash validation unit 330 may be configured to cause the AFDU 303 to receive various types of stimulus 320. The stimulus 320 may be indicative of an arc flash event. In the FIG. 3 example, the arc flash validation unit 330 includes a current output generator 334 and an EO radiation generator 336. The current output generator 334 is controlled by a current level module 340 and a test controller 342. The EO radiation generator 336 is controlled by an EO intensity module 344 and the test controller 342. Although now shown in FIG. 3, where the AFDU 303 uses other types of stimulus 320 to detect arc flash events (e.g., a voltage, chemical, pressure, temperature, or the like), the arc flash validation unit 330 may comprise additional stimulus generators (not shown) configured to provide corresponding stimulus 320.

The test controller 342 may be configured to provide stimulus 320 to the AFDU 303, and to detect arc flash detection signals generated by the AFDU 303 in response to the stimulus 320. The test controller 342 may be configured to determine the configuration and/or sensitivity of the AFDU 303 based on the stimulus 320 required to cause the AFDU 303 to generate an arc flash detection signal (e.g., the type, intensity, and/or duration of the stimulus 320). A response time of the AFDU 303 may be determined by inter alia comparing the time stimulus 320 is provided to the AFDU 303 to the time a response (if any) of the AFDU 303 detected (e.g., an arc flash detection signal, tripping signal, or other output is detected by the receiver 332).

In the FIG. 3 example, the arc flash validation unit is configured to generate current and EO stimulus 320 using the current output generator 334 and the EO generator 336. The test controller 342 may cause the EO radiation generator 336 to emit EO radiation at various levels (as controlled by an EO intensity module 344). Some of the EO radiation levels produced by the EO radiation generator 336 may be indicative of an arc flash event 350. The EO radiation generator 336 may include any EO-producing device known in the art including, but not limited to: a flash tube, a flash lamp, a flash bulb, an electric glow discharge lamp, a light emitting diode (LED), a laser device, a controlled arc producing device, or the like. The EO generator may emit EO radiation using an EO conductor 339, which may be electro-optically coupled to an optical receiver 317 of the AFDU 303. The EO conductor 339 may comprise a fiber-optic cable, a wave guide, one or more optical elements, or any other device or material capable of transmitting and/or directing EO radiation. The EO radiation produced by the EO radiation generator 336 may be configured to emit EO radiation within a housing (not shown) in the vicinity of components that have the potential to produce an arc flash event (e.g., switches, circuit breakers, or the like). In this way, an EO path between the EO receiver 317 and these devices may be tested and/or validated. Although FIG. 3 depicts a single EO radiation generator 336, the arc flash validation unit 330 could include any number of EO radiation generators configured to produce any number of types and/or intensities of EO radiation. Similarly, although a single EO conductor 339 is shown, the EO radiation generator 336 could be coupled to any number of EO outputs configured to direct EO radiation to various portions of a power system (e.g., via an EO multiplexer or the like). Therefore, the arc flash validation unit 330 should not be read as limited in this regard.

The test controller 342 may cause the current generator 334 to produce currents at various levels (as controlled by the current level module 340). The output 345 of the current output generator 334 may be communicatively and/or electrically coupled to a current input 311 of the AFDU 303. As discussed above, the current input 311 of the AFDU 303 may be configured to receive current measurements from a power conductor (not shown), such as the conductor 215 of FIG. 2 (e.g., using a CT, such as the CT 213 of FIG. 2). In some embodiments, the output 345 of the current output generator 334 may be coupled to the AFDU "upstream" from the CT (e.g., between the CT and the current input 311). This may allow the current output generator 334 to simulate an overcurrent condition on the conductor without producing a large amount of current on the conductor. Alternatively, or in addition, the current output generator 334 may be coupled "downstream" from the CT to validate the operation of the CT as well as the AFDU 303 connected thereto. In some embodiments, the current output generator 334 may be coupled to an IED (not shown) configured to acquire current measurements from the conductor. In this case, the current output generator 334 may be configured to cause the IED to return a particular current measurement without requiring the actual production of a current signal on a conductor and/or at the CT (e.g., via a simulated output received directly by the AFDU 303). Although FIG. 3 depicts a single current output generator 334, the arc flash validation unit 330 could include any number of current output generators. Similarly, the output 345 of the current output generator 334 could be selectively coupled to various different portions of the power system (e.g., via a multiplexer (not shown) or other device). Accordingly, the arc flash validation unit 330 should not be read as limited in this regard.

A clock module 346 may provide timing information to the test controller 332. The test controller 332 may use the timing information to coordinate the various types of stimulus 320 provided to the AFDU 303 and/or to determine a response time of the AFDU 303. The response time of the AFDU 303 may be the time required by the AFDU 303 to detect an arc flash (e.g., generate an arc flash detection signal, a tripping signal, or the like) responsive to the stimulus 320.

The clock module 346 may be in communication with a common time source 362, such as an absolute time source (IRIG via GPS satellites, WWB, WWVB, and the like). The clock module 346 may make a clock signal and/or timing information available to the test controller module 342, which may use the signal to implement various testing and/or validation operations. For example, the test controller 342 may acquire a "start time" from the clock module 346 as stimulus 320 is produced. An "end time" may be obtained when response of the AFDU 303 is detected (via the receiver 332). The response time of the AFDU 303 may be determined using the start time and the end time. Alternatively, or in addition, the clock module 346 may comprise a timer. The test controller 342 may start the timer when stimulus 320 is produced and may stop the timer if/when a response of the AFDU 303 is detected. If no response is detected from the AFDU 303, the clock module 346 may provide a timeout signal or other interrupt to the test controller 342.

The test controller 342 may be configured to estimate the energy that would be released by the arc flash event simulated by the stimulus 320 provided to the AFDU 303 (e.g., using Equation 1 of the IEEE 1584 standard) and according to the response time of the AFDU 303. The estimate may be based on the stimulus 320 provided to the AFDU 303, the response time of the AFDU 303, and/or the configuration of the power system 300 (e.g., the response of the protective elements (not shown) within the power system, the potentials within the power system, the nature of the power system components, and the like). The energy estimate may be used to define a protection boundary around the equipment protected by the AFDU 303, determine protective gear requirements for personnel working in the vicinity of the equipment, and/or may determine the arc flash resistance requirements of the components monitored and/or protected by the AFDU 303.

The test controller 342 may be configured to provide various test and validation programs (referred to herein as a test sequence). A test sequence may define one or more sets of stimulus to be provided to the AFDU 303. A test sequence may be generated by a human user (not shown) and/or by an external process or device (not shown), such as an automated testing process, or the like. A test sequence may be stored on a machine-readable storage media (not shown) accessible to the test controller 342. Alternatively, or in addition, the test controller 342 may include one or more built-in test sequences configured to perform common AFDU validation tasks (e.g., determine a configuration of the AFDU 303, determine a response time of the AFDU, or the like).

Using a test sequence, the test controller 342 may be configured to provide plural sets of stimulus 320 to the AFDU 303. The various sets of stimulus defined by the test sequence may vary the stimulus 320 type (e.g., EO, current, combination of EO and current, etc.), intensity, order, duration, and the like. The response of the AFDU 303 to each of the sets of stimulus 320 may be monitored. Arc flash detection signals generated by the AFDU 303 responsive to various sets of stimulus 320 may be detected by the arc flash validation unit 330. By modifying the stimulus 320 provided to the AFDU 303 and observing the responses of the AFDU 303 thereto, the arc flash validation unit 330 may determine a configuration of the AFDU 303. The configuration may include the nature of the stimulus 320 required to cause the AFDU 303 to detect an arc flash event (e.g., whether EO radiation and/or current alone is sufficient or whether both must be observed), the intensity of the stimulus 320 that is required (e.g., the sensitivity of the AFDU 303), and/or the response time of the AFDU 303 under the various conditions.

The arc flash validation unit 330 may include and/or be communicatively coupled to an HMI 360, which may comprise one or more display devices, printers, input/output devices, and the like. Information relating to the operation of the arc flash validation unit 330 may be provided to a human user via the HMI 360. For example, the HMI 360 may display indicators of the configuration of the AFDU 303, which may include the sensitivity of the AFDU 303, such as the type(s), intensity, duration, ordering, and so on, of the stimulus 320 required to cause the AFDU 303 to detect an arc flash event. In addition, the total energy estimate, protective boundary, protective gear requirements, arc flash resistance parameters, and the like may be displayed. The HMI 360 may provide one or more user interface components to allow a human user (or other process) to the control and/or program the arc flash validation unit 330. For example, the HMI 360 may provide a user interface through which a user may define a test sequence for the arc flash validation unit 330.

Although FIG. 3 shows the arc flash validation unit 330 coupled to a single AFDU 303, the validation unit 330 could be coupled to any number of additional arc flash detection units and/or IEDs (not shown). This may allow the arc flash validation unit 330 to validate a plurality of arc flash detection units as required.

Figure 4:
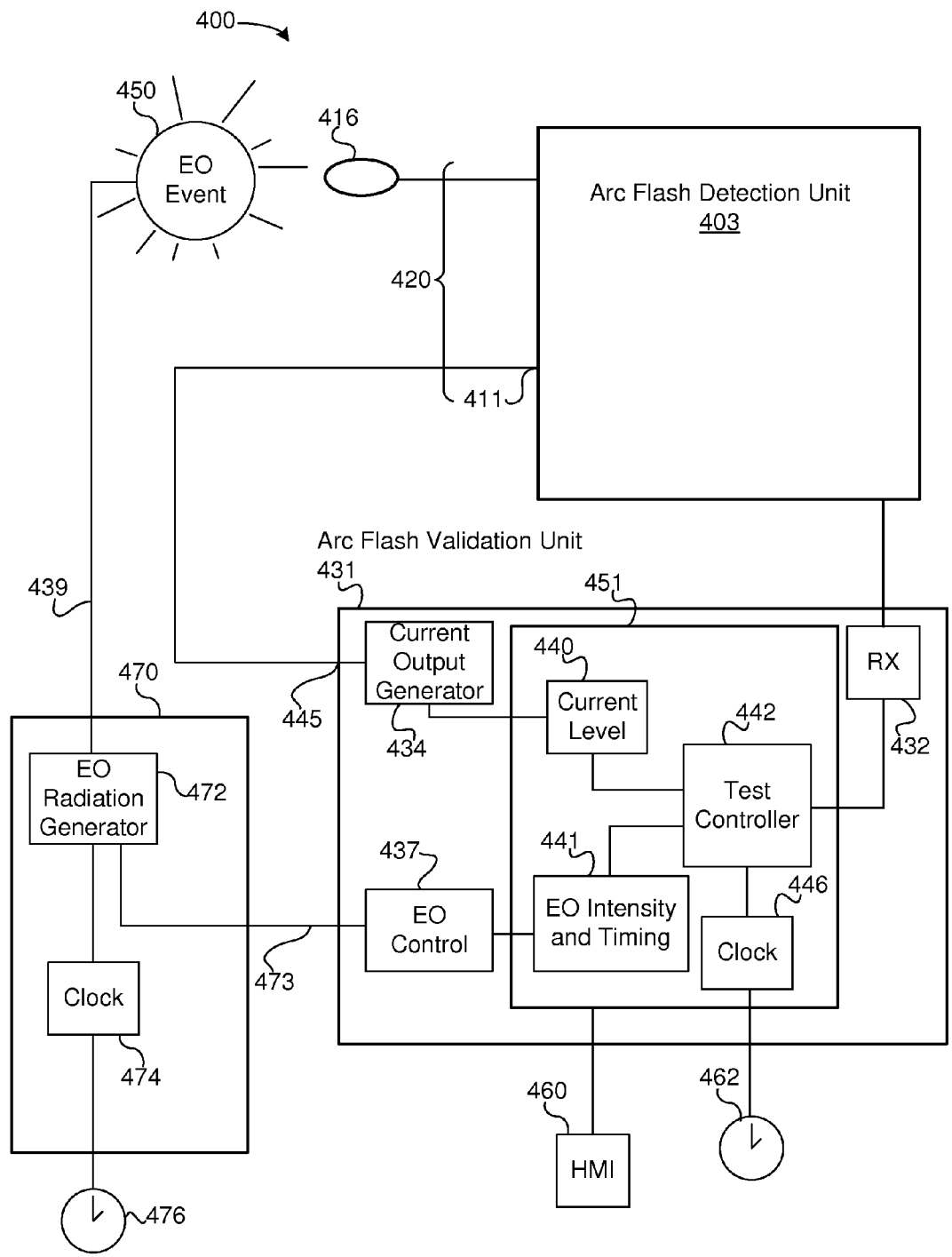
FIG. 4 is a functional block diagram of another embodiment of an arc flash validation unit.

FIG. 4 is a functional block diagram of another embodiment of an arc flash validation unit. The AFDU 403 of FIG. 4 receives stimulus 420 via respective measurement devices (e.g., an EO radiation collector 416 and/or a current input 411). The arc flash validation unit 431 may validate the operation and/or configuration of the AFDU 403.

The arc flash validation unit 431 comprises various modules, including a receiver module 432, a current level module 440, a current output generator 434, an EO intensity and timing module 441, an EO control module 437, a test controller 442, and a clock module 446. The arc flash validation unit 431 may be communicatively coupled to an EO generator device 470, which may comprise an EO radiation generator module 472 and a clock module 474. The system 400 further includes an HMI module 460, which may be part of the arc flash validation unit 431 or may be independent thereof.

Portions of the modules 432, 434, 437, 440, 441, 442, 446, 460, 472, and/or 474 (referred to herein as the FIG. 4 modules) may be implemented as machine readable and/or interpretable instructions. Alternatively, or in addition, portions of the FIG. 4 modules may be implemented as hardware components, including, but not limited to: analog circuitry components, integrated circuits (e.g., ASICS), configurable circuits (e.g., FPGA), and the like. Therefore, the arc flash validation unit 431, the EO generator device 470, and/or the HMI 460 may comprise respective processors (such as processor 451) configured to execute/interpret instructions comprising the FIG. 4 modules. As discussed above, the instructions may be stored on one or more computer-readable storage media (not shown) and, in some embodiments, may be embodied thereon as distinct software modules. Portions of the FIG. 4 modules may comprise and/or be implemented using hardware components. In addition, one or more of the FIG. 4 modules may be configured to operate and/or interact with particular machine components (e.g., communications interfaces, circuitry components, and the like) and, as such, may be tied to the particular machine components.

In the FIG. 4 example, an EO generator device 470 may be implemented separately from the arc flash validation unit 431. The arc flash validation unit 431 may be implemented using a test set device, such as a programmable logic controller-(PLC)-based device and/or a dedicated, general-purpose test set device (e.g., a protection relay test set), or the like. The arc flash validation unit 431 modules 432, 434, 437, 440, 441, 442, 446, and/or 450 may be implemented on the test set device. Alternatively, or in addition, the test set device may be implemented using a PLC (e.g., the processor 451 may comprise a PLC) within which the modules 440, 441, 442, and/or 446 may be implemented. The modules 432, 434, and/or 437 may be modularly and/or integrally coupled to the test set device (e.g., PLC 451 comprising modules 440, 441, 442, and/or 446) to provide the arc flash validation functions disclosed herein.

The test set device used to implement the arc flash validation unit 431 (e.g., the PLC or dedicated test set device) may not be capable of reliably producing EO radiation at the intensity and/or duration required for the validation of the AFDU 403 (e.g., may be incapable of producing/simulating an EO event 450 indicative of an arc flash). Accordingly, the EO radiation generator 470 may be provided to produce the required levels of EO radiation. The EO generator device 470 may include an EO radiation generator 472, a processor (not shown), a memory (not shown), one or more communication ports and/or interfaces 473, an HMI (not shown), and the like.

The EO generator device 470 may be configured to receive EO radiation control signals from the EO control module 437 of the arc flash validation unit 431. The EO control module 437 may be communicatively coupled to the EO generator device 470 using a dedicated communication port 473 and/or a communication network (e.g., Ethernet, SCADA, IEEE C37.118, SNMP, wireless network, IEEE 802.11 wireless network, or the like). In some embodiments, a communication interface between the arc flash validation unit 431 and the EO generator device 470 may include a clock or other timing signal. Alternatively, or in addition, the EO generator device 470 may include a clock module 474 communicatively coupled to a time source 476. The time source 474 may be the same time source 462 used by the arc flash validation unit 431 and/or may be synchronized to the time source 462. As discussed above, the time sources 476 and/or 462 may include an absolute time source (IRIG via GPS satellites, WWB, WWVB, or the like).

The EO radiation generator 472 may be capable of generating an EO event 450 indicative of an arc flash. EO radiation produced by the EO radiation generator 472 may be transmitted to the vicinity of an EO radiation collector 416 of the AFDU 403 via an EO conductor 439. The EO radiation generator 472 may include any EO-producing device known in the art including, but not limited to: a flash tube, a flash lamp, a flash bulb, an electric glow discharge lamp, a light emitting diode (LED), a laser device, a controlled arc producing device, or the like. Although FIG. 4 depicts a single EO generator device 470, the arc flash validation unit 431 could be communicatively coupled to any number of additional EO generator devices (not shown). In addition, although not shown in FIG. 4, the arc flash validation unit 431 may include one or more internal EO generators, such as the EO generator 336 of FIG. 3.

The clock module(s) 474 and/or 446 may be used to synchronize the arc flash validation unit 431 and the EO generator device 470. Validation of the AFDU 403 may require that stimulus 420 be provided to the AFDU 403 at particular times and/or in a particular order. Therefore, the test controller 442 may coordinate the timing and/or duration of the various types of stimulus 420 (e.g., may coordinate the current and EO radiation stimulus to be received by the AFDU 403 simultaneously and/or in a particular order (e.g., at a pre-determined time offset)). Other validation functions may require synchronism between stimulus types 420. For example, a test sequence executed by the test controller 442 may include one or more EO stimulus parameters, including, but not limited to: timing of the EO radiation, intensity of the EO radiation, duration of the EO radiation, or the like. The EO intensity and timing module 441 and/or EO control module 437 may communicate one or more of these parameters to the EO generator device 470. The EO generator device 470 may be configured to produce EO radiation (using the EO radiation generator 472) according to the parameters received from the arc flash validation unit 431. For example, the EO generator device 470 may use the clock module 474 to configure the EO radiation generator 472 to produce EO radiation at the appropriate time. The clock 474 may be synchronized to the clock 446 of the arc flash validation unit 431 (e.g., using a time source 476).

In some embodiments, the EO radiation generator 472 may impose a time delay between the time the generator 472 is to generate EO radiation and the time EO radiation is actually emitted therefrom. For example, the EO radiation generator 472 may be actuated by connecting a contact of a flash bulb to power, may require initiation of a chemical reaction, or the like. The mechanical and/or chemical operation(s) involved in producing the EO radiation (e.g., closing the contact) may introduce a time delay between the time the test controller 442 requests EO radiation (via the EO control module 437) and the time EO radiation is produced by the EO radiation generator 472. This time delay may cause a loss of synchronism between other types of stimulus 420. The EO generator device 470 may be configured to account for actuation delay of the EO radiation generator 472. For example, if the EO radiation generator 472 has a time delay of $T_d$ and the arc flash validation unit 403 requests EO radiation at time $T_{EO}$, the EO generator device 470 and/or the EO radiation generator 472 may be configured to actuate at $T_{EO}-T_d$.

Although FIG. 4 depicts the current output generator 434 as an integral part of the arc flash validation unit 431, one skilled in the art will recognize that the current output generator 434 could be implemented in a separate device (not shown) similar to the EO generator device 470. The current generator device (not shown) could be communicatively coupled to the arc flash validation unit 431 via a communication port/interface to receive requests to generate current, time synchronization signals, current stimulus parameters (e.g., intensity, duration, magnitude, phase, etc.), and the like.

Figure 5:
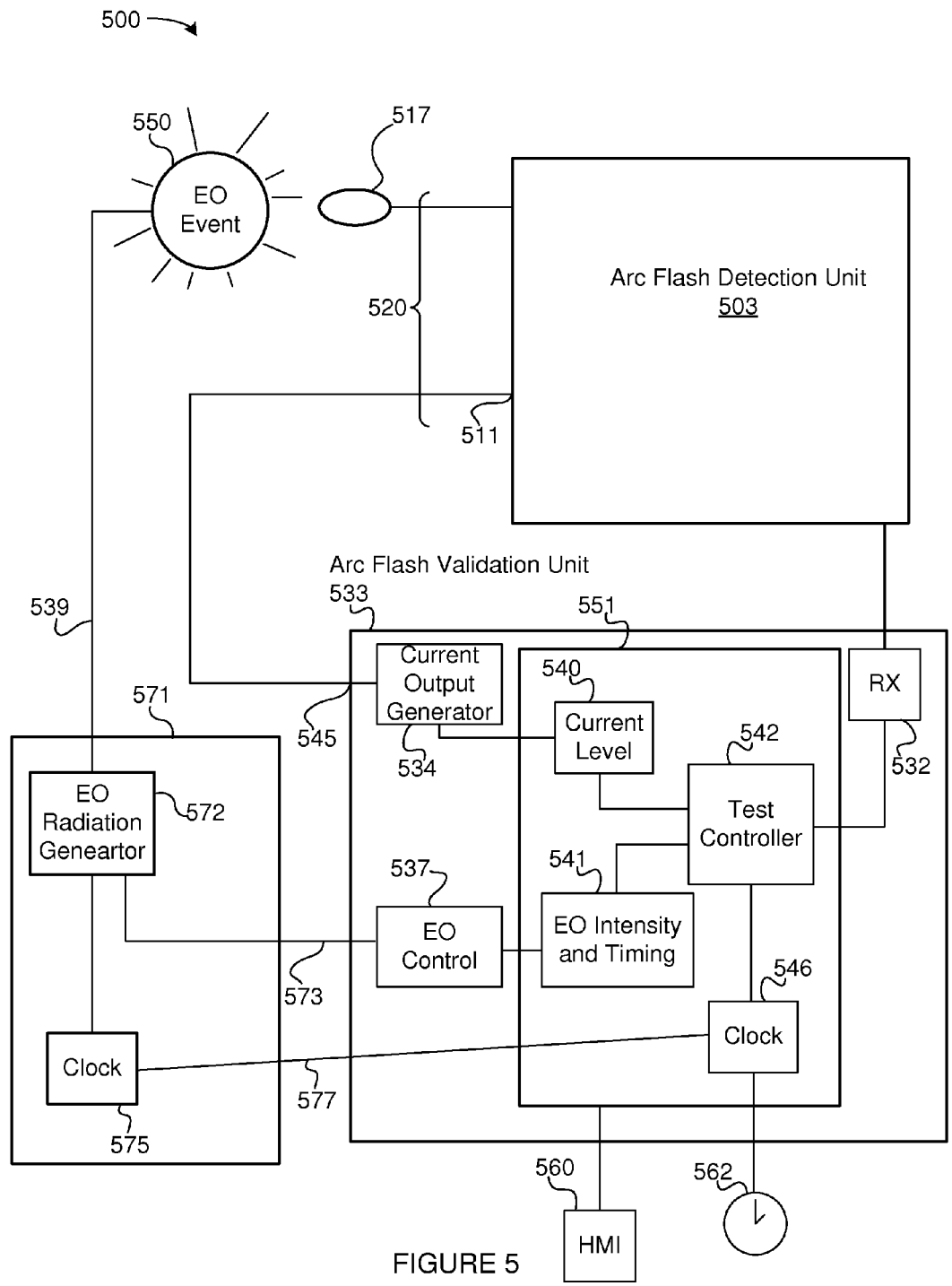
FIG. 5 is a functional block diagram of another embodiment of an arc flash validation unit.

FIG. 5 is a functional block diagram of another embodiment of an arc flash validation unit. The AFDU 503 of FIG. 5 receives stimulus 520 via respective measurement devices (e.g., an EO radiation collector 517 and/or a current input 511). The arc flash validation unit 533 may validate the operation and/or configuration of the AFDU 503.

The arc flash validation unit 533 of FIG. 5 comprises various modules, including a receiver module 532, a current level module 540, a current output generator 534, an EO intensity and timing module 541, an EO control module 537, a test controller 542, and a clock module 546. The EO generator device 571 comprises an EO radiation generator module 572 and a clock module 575. The system further includes an HMI module 560, which may be part of the arc flash validation unit 533 or may be independent thereof. Portions of the modules 532, 534, 537, 540, 541, 542, 546, 560, 572, and/or 575 (referred to herein as the FIG. 5 modules) may be implemented as machine readable and/or interpretable instructions. Alternatively, or in addition, portions of the FIG. 5 modules may be implemented as hardware components, including, but not limited to: analog circuitry components, integrated circuits (e.g., ASICS), configurable circuits (e.g., FPGAs), and the like. Therefore, the arc flash validation unit 533, the EO generator device 571, and/or the HMI 560 may comprise respective processors (such as processor 551) configured to execute/interpret instructions comprising the FIG. 5 modules. As discussed above, the instructions may be stored on one or more computer-readable storage media (not shown) and, in some embodiments, may be embodied thereon as distinct software modules. Portions of the FIG. 5 modules may comprise and/or be implemented using hardware components. In addition, one or more of the FIG. 5 modules may be configured to operate and/or interact with particular machine components (e.g., communications interfaces, circuitry components, and the like) and, as such, may be tied to the particular machine components.

The arc flash validation unit 533 may be implemented using a general purpose PLC and/or test set device, which may comprise the modules 532, 534, 537, 540, 541, 542, and 546. As discussed above, the PLC and/or test set device may be incapable of producing EO radiation of a type, intensity, and/or duration required to validate the AFDU 503. Therefore, the arc flash validation unit 533 may include an EO generator device 571, which may comprise an EO radiation generator 572 configured to produce EO radiation and to transmit the radiation to the vicinity of an EO radiation collector 517 of the AFDU 503 (e.g., using the EO conductor 539).

In the FIG. 5 example, the EO generator device 571 is communicatively coupled to the EO control module 537 via a communications interface 573, which may comprise any communications connection known in the art (e.g., a direct cable connection, a wireless connection, or the like). The EO generator device 571 may include a clock module 575, which may be synchronized and/or correlated to the clock module 546. The clock modules 575 and 546 may be synchronized and/or correlated using a communications channel 577 therebetween. The channel 577 may comprise a wireless and/or wired link between the clock modules 546 and 575 (e.g., using Network Time Protocol (NTP), IRIG, or the like). Although the clock module 546 is shown as communicatively coupled to an external common time source 562, the common time source 562 may be omitted. For example, the clock module 562 may act as a time source of the clock module 575 or vice versa.

As discussed above, the AFDU 533 may use the synchronism and/or correlation between the clock modules 546 and 575 to correlate the time various types of stimulus 520 are provided to the AFDU 503 (according to a test program implemented by the test controller 542). In addition, the time synchronism may allow the EO generator device 571 to account for a time delay imposed by a stimulus generator, such as the EO radiation generator 572.

FIGS. 6A through 6E illustrate various timing diagrams of the outputs from an arc flash validation unit (and test set, if used), such as the arc flash validation units 330, 431, and/or 533 described above, and an AFDU (e.g., the AFDU 203 described above). As can be seen in these figures, an AFDU may provide various types and/or levels of stimulus to an AFDU. In the example illustrated in FIGS. 6A through 6E, the AFDU provides varying current and EO radiation stimulus. The stimulus may be varied in terms of timing and/or intensity to validate the arc flash detection algorithm(s) implemented by an AFDU and/or the sensitivity of the AFDU.

Figure 6A:
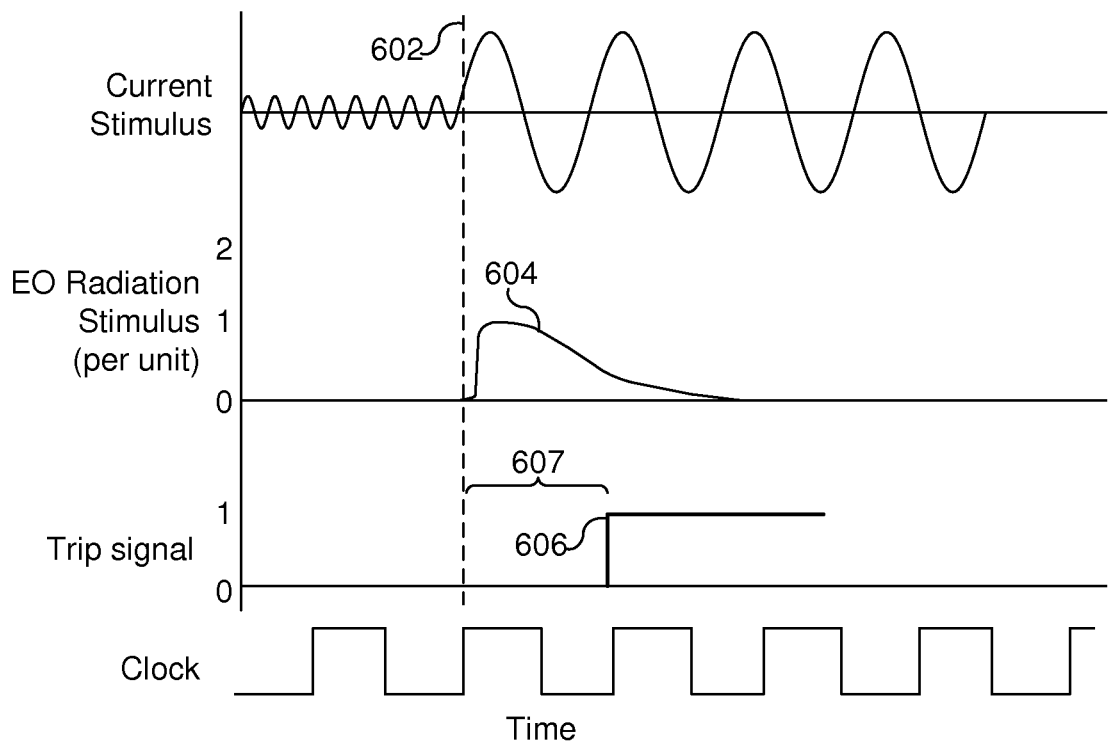
FIG. 6A-6E are plots of current and electro-optical radiation stimulus provided to an arc flash detection unit, and a response of the arc flash detection unit thereto.

For example, FIG. 6A illustrates a step up in current and an EO radiation flash 604 at time 602. The EO radiation flash 602 has an intensity of around one per unit (per unit of pickup of the EO sensor). A trip signal 606 was received by the arc flash validation unit approximately one cycle later. In some embodiments, the arc flash validation unit, or other device, may be configured to determine a response time 607 of the AFDU under test, which may be cased upon the time the EO and/or current stimulus was provided and the time the trip signal 606 is detected.

Figure 6B:
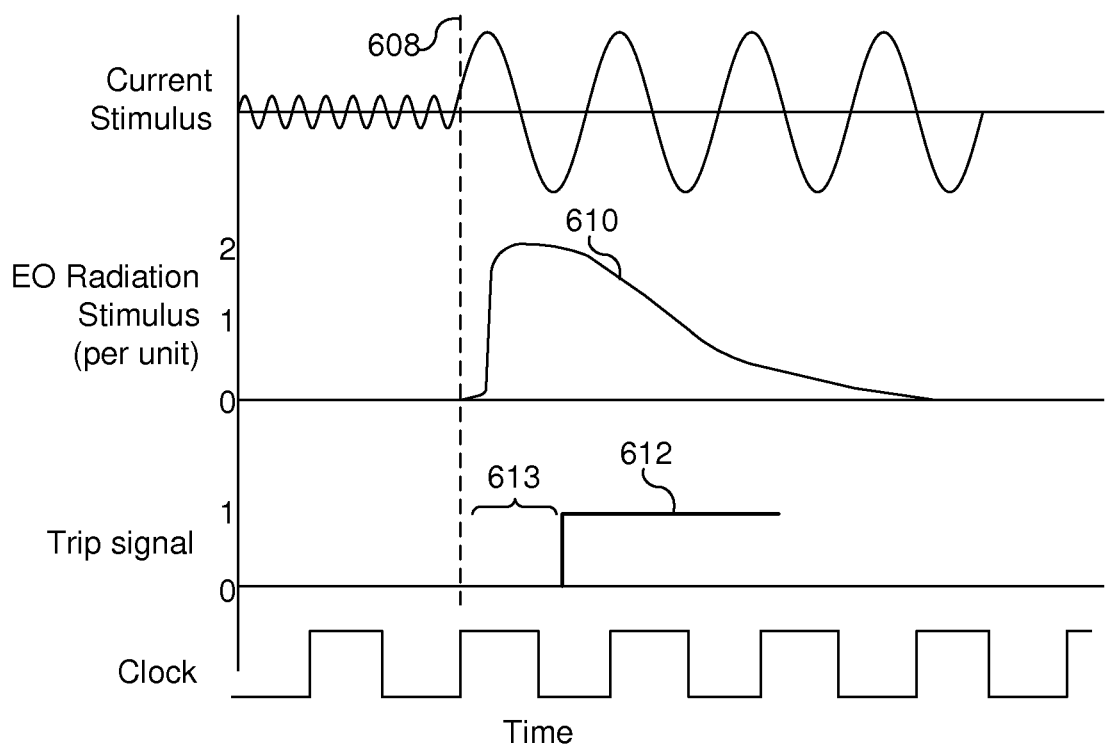

FIG. 6B illustrates a current step up at time 608 and an EO radiation flash with an intensity 610 of two times the pickup of the EO sensor. A trip signal 612 was received by the arc flash validation unit less than one cycle later after the response time 613 of the AFDU.

Figure 6C:
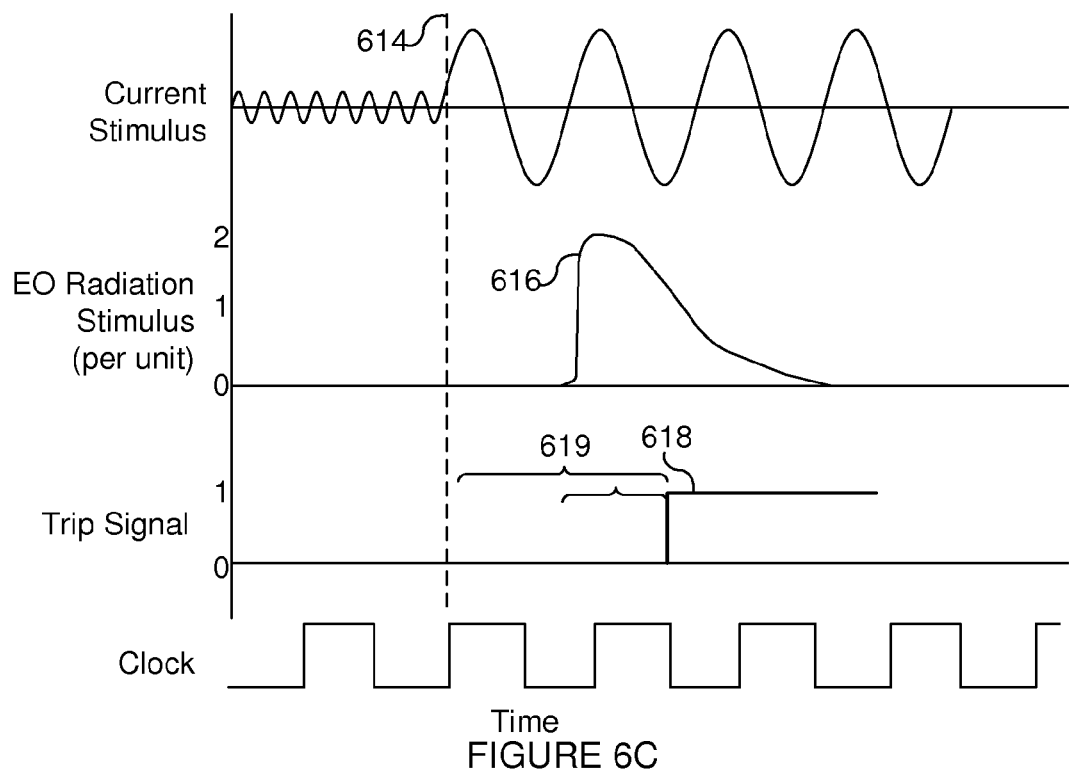

FIG. 6C illustrates a delayed EO flash. In this example, an EO radiation flash was delayed by about one cycle after the current step up stimulus was provided (at time 614). A trip signal 618 was received by the arc flash validation unit less than one-half cycle after the EO radiation stimulus was provided. The response time 619 of the AFDU may be the time 619 between assertion of the trip signal 618 and the time the current stimulus was provided (time 614) and/or the time the EO radiation stimulus 616 was provided.

Figure 6D:
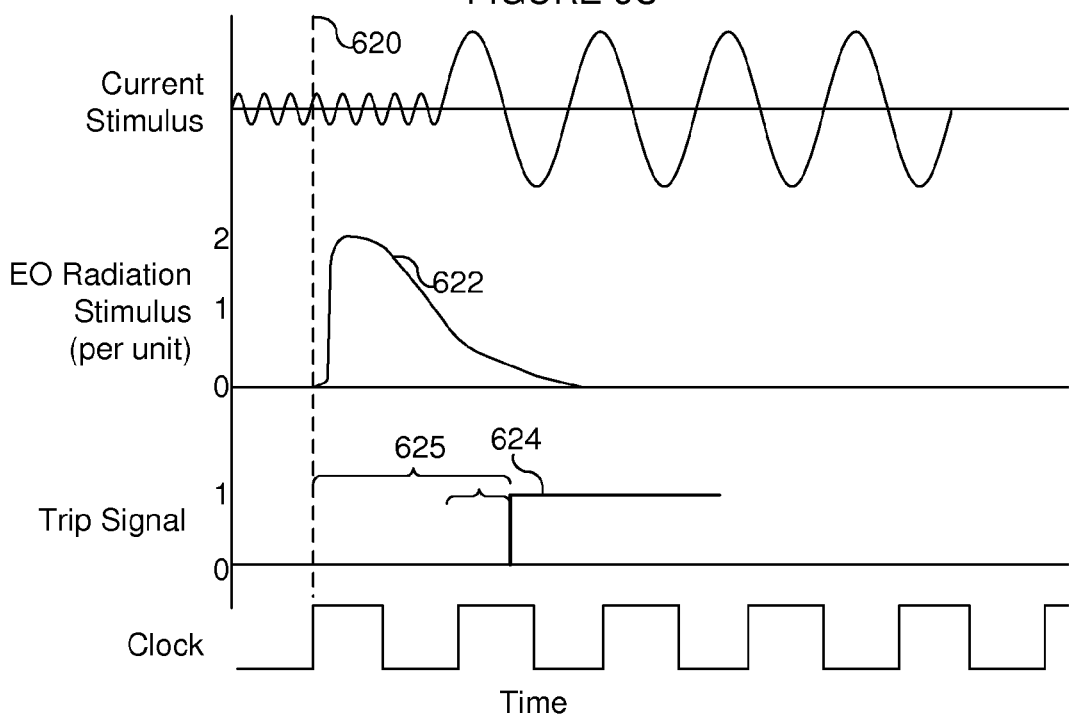

FIG. 6D illustrates that the EO flash 622 was given at time 620, but a step up in current did not follow for several cycles afterward. A trip signal 624 was received by the arc flash validation unit less than one-half cycle after the current step up was provided. The response time 625 of the AFDU may comprise the time between assertion of the trip signal 618 and the time 620 the EO radiation stimulus 622 was provided and/or the time the current stimulus was provided.

Figure 6E:
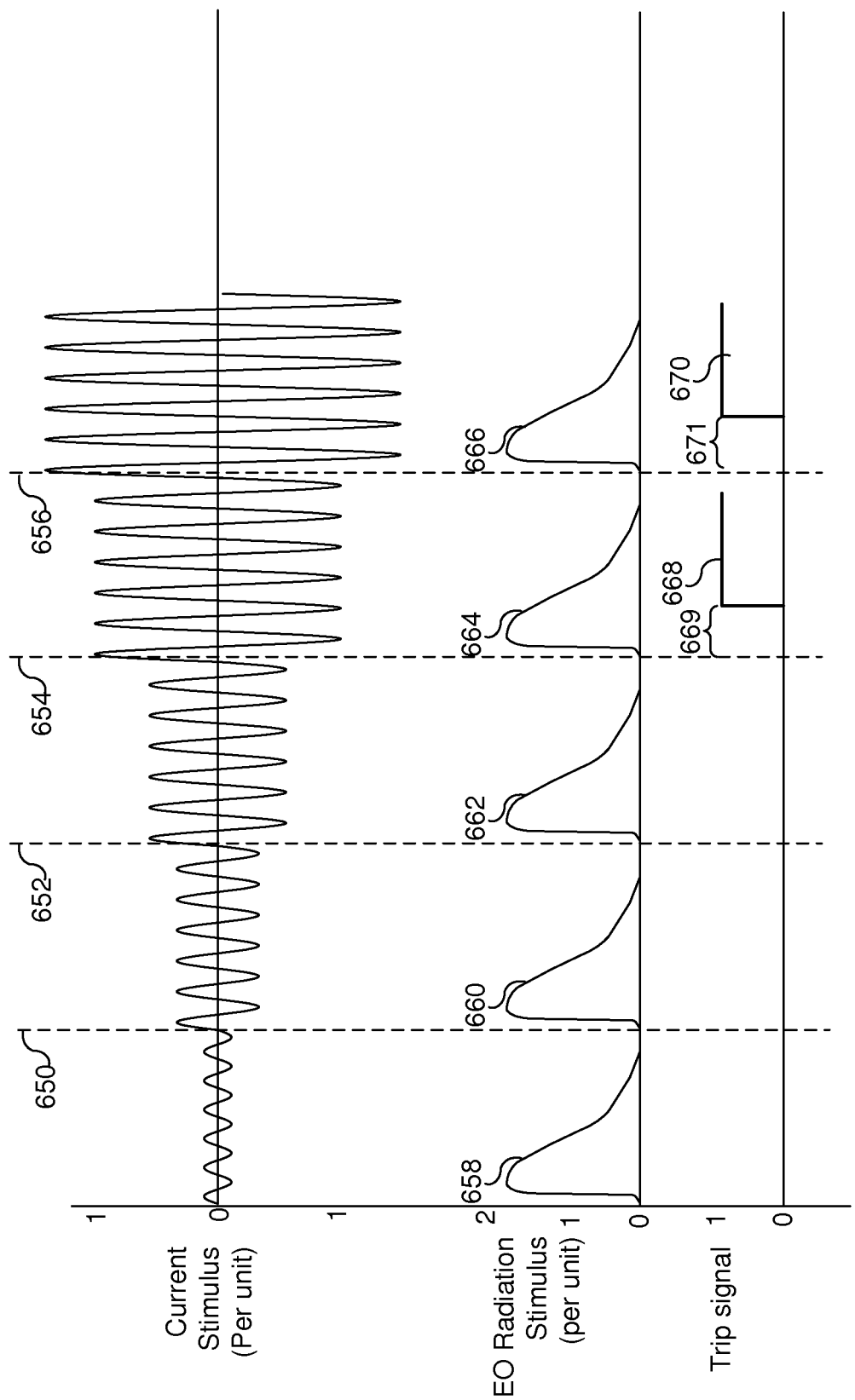

FIG. 6E shows yet another test pattern and the trip signals given by the AFDU. According to this test pattern, a current step up and an EO flash were given on a scheduled basis. In one example, the schedule is for a current step up and the EO flash to be given at the top of each second. Illustrated is a step up and flash given each 1/10th of a second. The current finally stepped up to one per unit (where per unit is per unit of the trip setting) at time 654. A trip signal 668 was generated shortly after the current was stepped up and the EO flash stimulus 664 was given. Likewise, another trip signal 670 was generated after the current was stepped up yet again at time 656 and a flash stimulus 666 was given. Response times 669 and 671 may be determined for each tripping signal 668 and 670.

Figure 7:
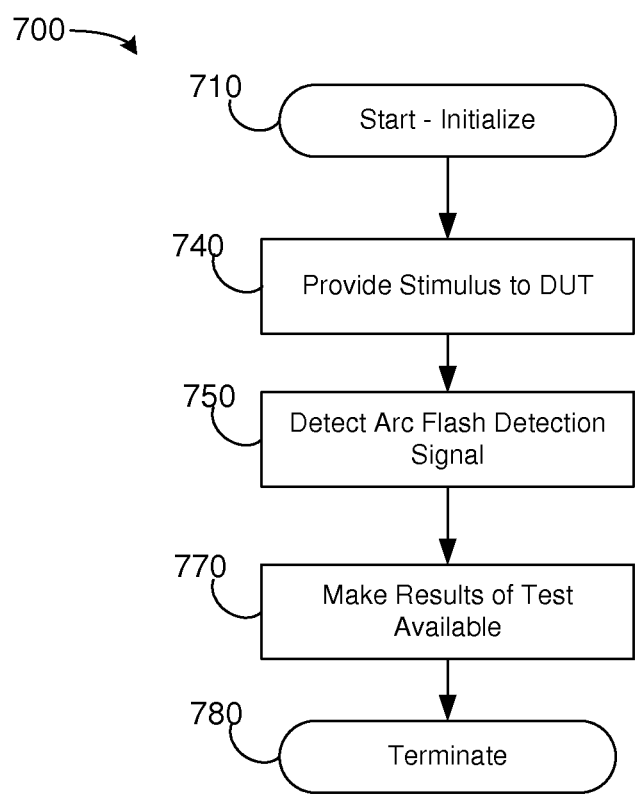
FIG. 7 is a flow diagram of one embodiment of a method for validating an arc flash detection unit.

FIG. 7 is a flow diagram of one embodiment of a method 700 for validating an AFDU.

At step 710, the method 700 may start and/or be initialized, which may comprise loading one or more machine-readable and/or machine-interpretable instructions from a computer-readable storage media. In addition, step 710 may comprise accessing and/or allocating one or more hardware components, such as communications interfaces (e.g., receivers, transmitters, and the like), stimulus generators, HMI components, or the like. Initializing may further include accessing a time source and/or accessing an arc flash detection signal (e.g., tripping signal output) of the arc flash detection unit being validated by the method 700.

At step 740, the method 740 may provide stimulus to the AFDU being validated (referred to herein as the device under test or "DUT"). The stimulus may comprise any number of different types of stimulus including, but not limited to: current stimulus, voltage stimulus, EO radiation stimulus, chemical stimulus, or the like. In some embodiments, providing stimulus at step 740 may comprise causing an IED, or other device configured to provide measurements to the DUT, to provide simulated measurements, which, as discussed above, may be indicative of an arc flash event. Alternatively, or in addition, the stimulus may be provided directly to one or more sensors communicatively coupled to the DUT. The different types of stimulus may be provided at the same time (concurrently) and/or in a particular order (overlapping or nonoverlapping).

At step 750, the method 750 may detect a response (if any) of the DUT to the stimulus. The detection of step 750 may occur as the stimulus is being provided at step 740. Accordingly, steps 740 and 750 may be implemented simultaneously. The output detected at step 750 may comprise an arc flash detection signal (e.g., a tripping signal, an alarm message, or the like). Alternatively, if the stimulus provided at step 740 did not cause the DUT to detect an arc flash event (e.g., the EO radiation and/or current levels were below the thresholds of the DUT), no detection signal may be received. A no-arc flash signal detected state may be determined if no arc flash detection signal (or other indicator) is produced by the DUT within a predetermined time threshold and/or during the time the stimulus is provided at step 740.

At step 770, results of the validation (e.g., the stimulus provided to the DUT and the response received therefrom) may be stored and/or made available to a human user via an HMI or other device. In some embodiments, the results may be transmitted to an external device and/or process (not shown), such as a network-accessible computer-readable storage medium (e.g., server computer, database, or the like). The testing results may include indicators of the configuration of the DUT, which may include, but is not limited to: a sensitivity of the DUT (e.g., the level of EO radiation stimulus and/or current stimulus required to trigger an arc flash detection signal from the DUT), a response time of DUT under various conditions (e.g., response times of the DUT under different stimulus types, intensities, duration, and the like), an estimate of the total energy that would have been released by an actual arc flash event, a safe working boundary around equipment monitored and/or protected by the DUT, arc flash resistance requirements for equipment monitored and/or protected by the DUT, and the like.

The results may be displayed to a human user via an HMI. As discussed above, the results (e.g., the total energy released by an arc flash event) may be used to define a safe working boundary and/or protective gear requirements for those working in the vicinity of equipment monitored and/or protected by the DUT. Alternatively, or in addition, the results may be used to validate existing safety procedures for such equipment (e.g., validate an existing safety boundary and/or protective gear requirement). Similarly, the results may be used in the selection of equipment to be monitored/protected by the DUT. For example, some components may have an arc flash resistance rating. The results of the method 700 displayed and/or made available at step 770, may allow for the proper selection of such components.

At step 780, the flow may terminate.

Figure 8:
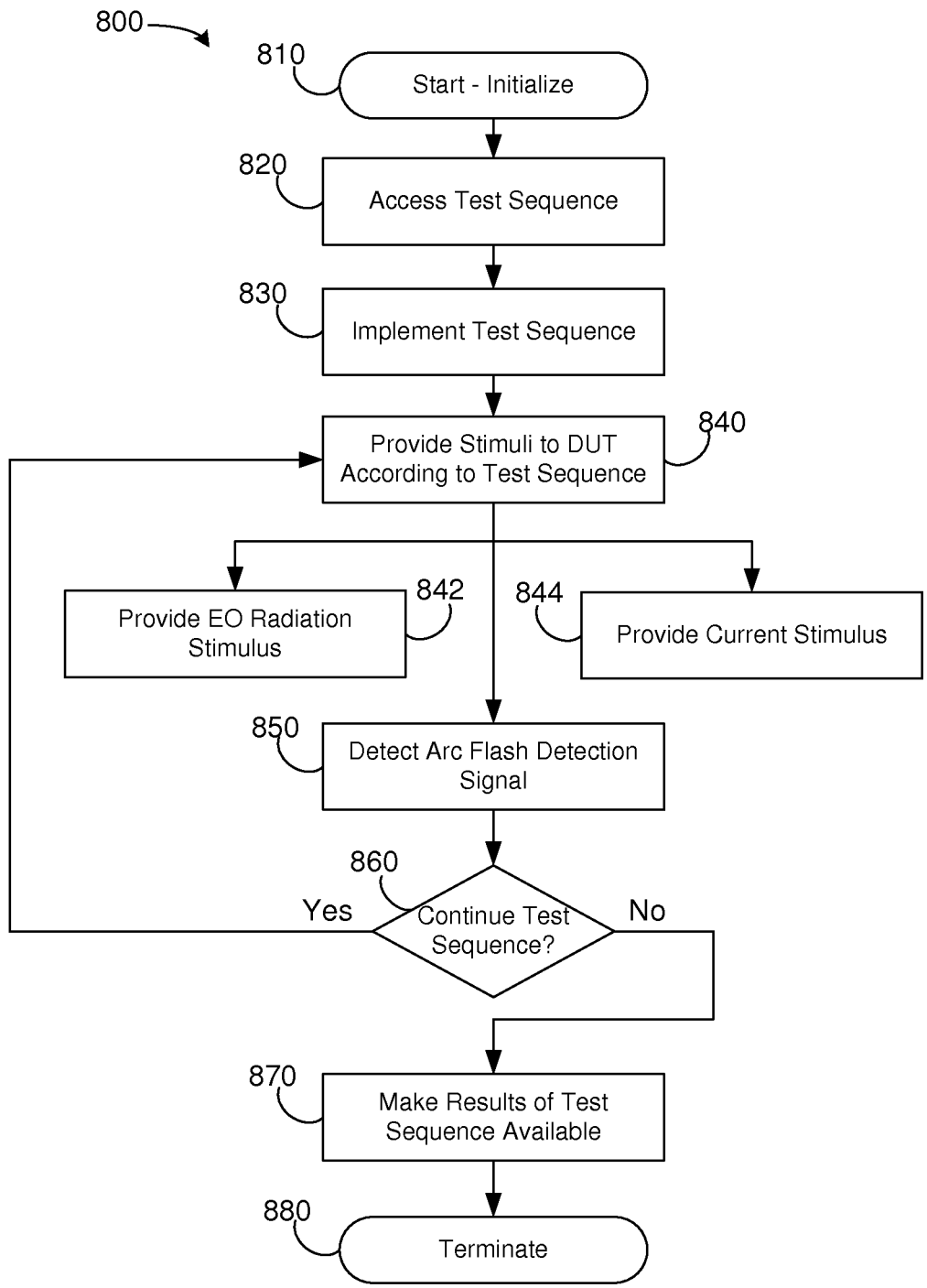
FIG. 8 is a flow diagram of another embodiment of a method for validating an arc flash detection unit.

FIG. 8 is a flow diagram of one embodiment of a method 800 for validating an AFDU.

At step 810, the method 800 may be start and/or be initialized as described above.

At step 820, the method 800 may access a test sequence, which may define a set of stimulus to provide to the DUT. The test sequence may comprise machine-readable and/or machine-interpretable instructions stored on computer-readable storage media. Alternatively, or in addition, the test sequence may be defined by a human user via an HMI or other device.

The test sequence accessed at step 820 may define a set of stimulus to be provided to the DUT. Accordingly, the test sequence may comprise various stimulus parameters including, but not limited to: the type of stimulus to be provided to the DUT, the timing of the stimulus, the duration of the stimulus, the intensity, ordering, repetition, and the like. In the FIG. 8 example, the stimulus may include an EO radiation and/or current stimulus. Method 800, however, is not limited in this regard and, as such, could encompass any other type of stimulus.

At step 830, the method 800 may implement the test sequence accessed at step 820. Implementing the test sequence may comprise storing a start time for the test sequence (e.g., accessing a time stamp, starting a timer, or the like). In some embodiments, implementing the test sequence may comprise transmitting stimulus parameters to one or more test set devices, such as the remote EO radiation generators 470 and/or 571 described in conjunction with FIGS. 4 and 5, respectively.

At step 840, a set of stimulus defined in the test sequence may be provided to the DUT. As discussed above, a DUT may be provided with multiple types of stimulus (e.g., EO radiation stimulus and current stimulus) at various different levels and/or in various different orders. Therefore, step 840 may comprise parallel steps 842 and 844.

At step 842, EO radiation stimulus may be provided to the DUT. The EO radiation stimulus may be provided according to the stimulus parameters in the test sequence accessed at step 830, which, as discussed above, may specify the intensity, order, and/or timing of the stimulus that is to be provided. The stimulus may be generated by any device, material, and/or apparatus capable of generating and/or simulating EO radiation stimulus including, but not limited to: a flash bulb, an LED, an incandescing bulb, a chemical reaction, an arc, or the like. The EO stimulus produced at step 842 may be transmitted to the DUT using any device, material, and/or apparatus capable of transmitting and/or directing EO radiation including, but not limited to: fiber optics, one or more lenses, reflective materials, wave guides, or the like. Alternatively, or in addition, the EO stimulus may be simulated (e.g., may comprise simulated readings from an EO sensor).

At step 844, current stimulus may be provided to the DUT. The current stimulus may be provided according to the stimulus parameters in the test sequence accessed at step 830, which, as discussed above, may specify the nature and/or timing of the stimulus to be provided. The stimulus may be generated by any device, material, and/or apparatus capable of generating and/or simulating current stimulus, including, but not limited to: a battery, a capacitor, a power source, or the like. The current stimulus produced at step 844 may be received by the DUT at a CT communicatively coupled thereto, may be received "upstream" from the CT, may be a simulated input to the DUT, or the like.

At step 850, the method 800 may be configured to detect an arc flash detection signal generated by the DUT (e.g., a tripping signal generated by an AFDU or another signal generated by the DUT indicative that the DUT detected an arc flash event responsive to the stimulus provided at steps 842 and/or 844). The detecting of step 850 may occur after stimulus is provided to the DUT and/or while the stimulus is being provided (e.g., concurrently with steps 842 and 844).

In some cases, the DUT may not generate a tripping signal. For example, and as shown in FIG. 6E, some stimulus levels and/or types may be insufficient to cause the DUT (AFDU) to assert a tripping signal. The amount of stimulus required to generate a tripping signal may vary according to the configuration of the DUT (e.g., the sensitivity of the DUT, the configuration of the DUT, the arc flash detection algorithm used by the DUT, or the like). The method 800 may be configured to determine the time the arc flash detection signal (if any) is received. This may allow for a response time of the DUT to be determined. Upon receiving an arc flash detection signal (or determining that no arc flash detection signal is to be produced, e.g., due to a time out or other condition), the flow may continue at step 860.

At step 860, the method 800 may determine whether the test sequence calls for additional testing of the DUT (e.g., if additional types and/or magnitude of stimulus are to be provided to the DUT). If the test sequence (or control program) calls for additional stimulus, the flow may return to step 830, where a next test sequence and/or a next portion of a test sequence may be accessed; otherwise, the flow may continue to step 870.

At step 870, results of the test sequence may be stored and/or made available to a human user via an HMI or other device. As discussed above, in some embodiments, the results may be transmitted to an external device and/or process (not shown), such as a network-accessible computer-readable storage medium (e.g., server computer, database, or the like). The testing results may include indicators of the configuration of the DUT that may include, but are not limited to: a sensitivity of the DUT (e.g., the level of EO radiation stimulus and/or current stimulus required to trigger an arc flash detection signal from the DUT), a response time of the DUT under various conditions (e.g., response times of the DUT to various types of stimulus), estimates of total energy released in an arc flash event under the various testing scenarios, a safe working boundary around equipment monitored and/or protected by the DUT, arc flash resistance requirements for equipment monitored and/or protected by the DUT, and the like.

The results may be displayed to a human user via an HMI. As discussed above, the results (e.g., the total energy released by an arc flash event) may be used to define a safe working boundary and/or protective gear requirements for those working in the vicinity of equipment monitored and/or protected by the DUT. Alternatively, or in addition, the results may be used to validate existing safety procedures for such equipment (e.g., validate an existing safety boundary and/or protective gear requirement). Similarly, the results may be used in the selection of equipment to be monitored/protected by the DUT. For example, some components may have an arc flash resistance rating. The results of the method 800 displayed and/or made available at step 870, may allow for the proper selection of such components. In some embodiments, the results of step 870 may be used to clear personnel to work in the vicinity of power system equipment. For example, an enclosure may include a locking mechanism, which may not be opened until an AFDU monitoring/protecting the power system components within the enclosure has been validated.

At step 880, the flow may terminate.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of media/machine-readable storage media suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the invention.

What is claimed is:

1. An apparatus for validating an arc flash detection unit (AFDU), the AFDU configured to generate an arc flash detection signal responsive to stimulus indicative of an arc flash event, the apparatus comprising:
   a stimulus generator in communication with the AFDU, the stimulus generator comprising a first stimulus generator configured to provide a first type of test stimulus to the AFDU and a second stimulus generator configured to provide a second, different type of test stimulus to the AFDU; and
   a test controller of the apparatus in communication with the stimulus generator and configured to cause the first and the second stimulus generators to provide the first and the second type of test stimulus to the AFDU concurrently and to detect a response of the AFDU to the test stimulus, wherein the response comprises an arc flash detection signal, and
   wherein the test controller is further configured to determine a configuration of an arc flash detection algorithm of the AFDU based on the detected response of the AFDU to the first and second type of test stimulus, wherein the configuration of the arc flash detection algorithm corresponds to a relationship between the first and second types of test stimulus required to trigger the arc flash detection algorithm.

2. The apparatus of claim 1, wherein the first stimulus generator is configured to provide current stimulus to the AFDU.

3. The apparatus of claim 2, wherein the current stimulus provided to the AFDU is configured to be detected by the AFDU as current stimulus indicative of an arc flash event.

4. The apparatus of claim 1, wherein the second stimulus generator is configured to provide electro-optical (EO) stimulus to the AFDU.

5. The apparatus of claim 4, wherein the second stimulus generator is configured to emit EO radiation configured to be detected by an EO sensor of the AFDU as EO stimulus indicative of an arc flash event.

6. The apparatus of claim 1, wherein the test controller is configured to cause the first and the second types of test stimulus to be provided to the AFDU simultaneously.

7. The apparatus of claim 1, wherein the test controller is configured to cause the first and the second types of test stimulus to be provided to the AFDU nonsimultaneously.

8. The apparatus of claim 1, further comprising a clock communicatively coupled to the test controller, wherein the test controller is configured to coordinate operation of the first and the second stimulus generators using the clock, wherein coordinating operation of the first and second stimulus generators comprises determining a time the first and/or second stimulus generators provide test stimulus to the AFDU and/or determining a duration of the test stimulus provided to the AFDU by the first and/or second stimulus generators.

9. The apparatus of claim 1, further comprising a first clock communicatively coupled to the test controller and a second clock communicatively coupled to the second stimulus generator and synchronized with the first clock, wherein the test controller is configured to provide to the second stimulus generator, stimulus parameters specifying a time the second stimulus generator is to provide test stimulus to the AFDU, and wherein the second stimulus generator is configured to provide test stimulus to the AFDU at the specified time using the second clock.

10. The apparatus of claim 1, wherein the test controller is configured to determine a response time of the AFDU using a clock communicatively coupled to the test controller.

11. The apparatus of claim 10, wherein the test controller is configured to calculate an energy estimate of the energy that would be released by an actual arc flash event based on the test stimulus provided to the AFDU and the response time of the AFDU.

12. The apparatus of claim 11, further comprising a human-machine interface communicatively coupled to the test controller and configured to display one of an indicator of the test stimulus provided to the AFDU, a response time of the AFDU, the energy estimate, a safety perimeter around equipment monitored by the AFDU, and a protective gear requirement, wherein the safety perimeter and the protective gear requirement are based on the energy estimate.

13. A non-transitory computer-readable storage medium comprising instructions to cause a test controller to perform a method for validating an AFDU, the AFDU configured to assert an arc flash detection signal responsive to stimulus indicative of an arc flash event, the method comprising:
   the test controller causing a stimulus generator separate from and in communication with the AFDU to generate a first type of test stimulus for receipt by the AFDU and a second, different type of test stimulus for receipt by the AFDU, the stimulus indicative of an arc flash event;
   detecting a response of the AFDU to the first and second different types of test stimulus, wherein the response comprises an arc flash detection signal generated by the AFDU; and
   determining a configuration of the AFDU pertaining to an inverse time over stimulus relationship between the first and second types of test stimulus.

14. The non-transitory computer-readable storage medium of claim 13, wherein causing the stimulus generator to generate test stimulus for receipt by the AFDU comprises causing the stimulus generator to generate a current signal for receipt by the AFDU, wherein the current signal is indicative of an arc flash event.

15. The non-transitory computer-readable storage medium of claim 14, wherein causing the stimulus generator to generate test stimulus for receipt by the AFDU further comprises causing EO radiation to be emitted in the vicinity of an EO sensor of the AFDU, wherein the EO radiation is configured to cause the EO sensor to detect EO radiation of a wavelength and intensity indicative of an arc flash event.

16. The non-transitory computer-readable storage medium of claim 15, wherein the current stimulus and the EO stimulus are generated simultaneously.

17. The non-transitory computer-readable storage medium of claim 13, the method further comprising using a clock communicatively coupled to the test controller to determine a response time of the AFDU, wherein the response time is based on a time the test stimulus is generated and a time the arc flash detection signal is detected.

18. The non-transitory computer-readable storage medium of claim 17, the method further comprising calculating an energy estimate of an energy released by an arc flash event corresponding to the test stimulus provided to the AFDU and the response time of the AFDU.

19. The non-transitory computer-readable storage medium of claim 18, the method further comprising displaying the energy estimate on a human-machine interface.

20. The non-transitory computer-readable storage medium of claim 19, wherein displaying the energy estimate comprises displaying a safety perimeter around and/or a protective gear requirement to work in the vicinity of equipment monitored by the AFDU, wherein the safety perimeter and/or the protective gear requirement is based on the estimate.

21. The non-transitory computer-readable storage medium of claim 13, the method further comprising:
performing a test sequence comprising,
causing the stimulus generator to sequentially generate plural sets of test stimulus, each set of test stimulus comprising stimulus of varying intensity and/or type for receipt by the AFDU, and
detecting a response of the AFDU to a set of test stimulus.

22. The non-transitory computer-readable storage medium of claim 21, wherein one or more sets of test stimulus comprise a first type and second type of stimulus, and wherein the one or more sets of test stimulus vary an order in which the stimulus generator generates the first type and the second type of stimulus.

23. The non-transitory computer-readable storage medium of claim 22, wherein a set of test stimulus comprises EO stimulus and current stimulus.

24. A method for determining the configuration of an AFDU, the AFDU configured to assert an arc flash detection signal responsive to detecting stimulus indicative of an arc flash event, the method comprising:
configuring communication with the AFDU of a test controller including a stimulus generator, separate from the AFDU;
the stimulus generator providing plural sets of test stimulus to an the AFDU, wherein each set of test stimulus comprises a combination of current stimulus and EO stimulus, and wherein each set of test stimulus is provided to the AFDU at a known time;
detecting a response of the AFDU to each of the plural sets of test stimulus; and
determining a configuration of the AFDU pertaining to timing and intensity of current test stimulus and EO test stimulus based on the detected response of the AFDU to the plural sets of stimulus.

25. The method of claim 24, further comprising:
calculating an energy estimate for each set of test stimulus, each energy estimate based on an energy that would be produced by an arc flash event corresponding to the set of test stimulus and/or the response time of the AFDU to the set of test stimulus; and
determining a safety perimeter and/or a protective gear requirement for equipment monitored by the AFDU based on one of more of the energy estimates.

* * * * *

UNITED STATES PATENT AND TRADEMARK OFFICE
Certificate

Patent No. 8,664,961 B2                                                                  Patented: March 4, 2014

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Mark L. Zeller, Pullman, WA (US); Angelo D'Aversa, Lafayette Hills, PA (US); Gary W. Scheer, Pullman, WA (US); and Thomas M. Bartman, Pullman, WA (US).

Signed and Sealed this Twenty-fifth Day of November 2014.

ARLEEN VAZQUEZ
*Supervisory Patent Examiner*
Art Unit 2868
Technology Center 2800